United States Patent [19]

Sasame et al.

[11] Patent Number: 5,010,388
[45] Date of Patent: Apr. 23, 1991

[54] CONNECTION STRUCTURE BETWEEN COMPONENTS FOR SEMICONDUCTOR APPARATUS

[75] Inventors: Akira Sasame; Hitoyuki Sakanoue; Hisao Takeuchi; Masaya Miyake; Akira Yamakawa; Yasuhisa Yushio; Hitoshi Akazawa, all of Hyogo, Japan

[73] Assignee: Sumitomo Electric Industries, Ltd., Osaka, Japan

[21] Appl. No.: 212,944

[22] Filed: Jun. 28, 1988

[30] Foreign Application Priority Data

| Jul. 3, 1987 | [JP] | Japan | 62-165190 |
| Jul. 14, 1987 | [JP] | Japan | 62-175070 |
| Oct. 30, 1987 | [JP] | Japan | 62-275277 |
| Dec. 15, 1987 | [JP] | Japan | 62-315330 |

[51] Int. Cl.$^5$ .............. H01L 23/48; H01L 23/02; H01L 39/02; H01L 29/44
[52] U.S. Cl. .............. 357/70; 357/67; 357/74; 357/80; 357/71
[58] Field of Search .............. 357/70, 74, 82, 80, 357/67, 71, 67; 174/16, 52; 428/621, 622

[56] References Cited

U.S. PATENT DOCUMENTS

| 4,704,320 | 11/1987 | Mizunya et al. | 428/210 |
| 4,729,010 | 3/1988 | Tsuchiya et al. | 357/70 |
| 4,761,345 | 8/1988 | Sato et al. | 428/552 |
| 4,761,518 | 8/1988 | Butt et al. | 174/52 |
| 4,764,435 | 8/1988 | Hasizaki et al. | 428/621 |
| 4,835,065 | 5/1989 | Sato et al. | 428/622 |
| 4,873,151 | 10/1989 | Sato et al. | 428/627 |

OTHER PUBLICATIONS

MIL-STD-883B of Aug. 31, 1977; Method 2004.3.

Primary Examiner—Jerome Jackson, Jr.
Assistant Examiner—D. Monin
Attorney, Agent, or Firm—W. G. Fasse; D. H. Kane, Jr.

[57] ABSTRACT

A connection structure between lead frames and a base plate of aluminum nitride, to be applied as a connection structure between components of a semiconductor apparatus, has a base plate made of a sintered body of aluminum nitride on which a semiconductor device is to be mounted. The lead frames are made of iron alloy containing nickel in 29 wt. % and cobalt in 17 wt. %. A silver solder is used for joining the base plate and the lead frames. A surface of the lead frame to be joined to the base plate is clad with a stress relief layer of oxygen-free copper of a high plastic deformability to relieve, by its plastic deformation, a thermal stress caused by a difference between a thermal expansion coefficient of the aluminum nitride base plate and that of the lead frame in a cooling process at the time of soldering. Preferably, only a portion of each lead frame to be joined to the base plate comprises an inner layer of an iron alloy containing 29 wt. % of nickel and 17 wt. % of cobalt, and an outer layer portion of oxygen-free copper.

9 Claims, 11 Drawing Sheets

FIG.6CII
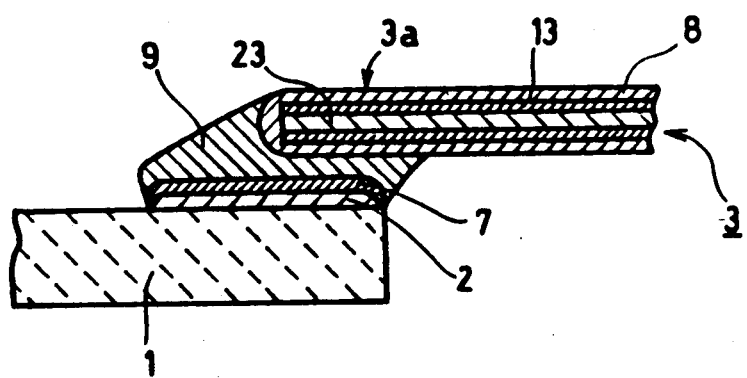

CONNECTION STRUCTURE BETWEEN COMPONENTS FOR SEMICONDUCTOR APPARATUS

SUMMARY OF THE INVENTION

It is an object of the present invention to provide a connection structure between components of a semiconductor apparatus, which uses a base member of aluminum nitride having good head dissipation suitable for mounting of a semiconductor device involving considerable heat generation and makes it possible to join a connection member to the base member with an appropriate junction strength.

According to the present invention it has been found that the residual strain due to thermal stress caused by the cooling process after soldering can be relieved effectively if a specified thermal stress relieving member is interposed between a base member of aluminum nitride and a connection member including as a main material any of iron-nickel alloys and iron-nickel-cobalt alloys.

According to an aspect of the present invention, a connection structure between components of a semiconductor apparatus comprises: a base member of aluminum nitride having a major surface on which a semiconductor device is to be mounted; a connection member including, as a main material, any of iron-nickel alloys and iron-nickel-cobalt alloys; a stress relieving member; and a solder member for joining the base member, the stress relieving member and the connection member. The stress relieving member is interposed between the base member and the connection member and it is made of any soft metal or soft alloys having a high plastic deformability to relieve the thermal stress caused by the difference between the thermal expansion coefficient of the base member and that of the connection member by plastic deformation of the stress relieving member itself.

Preferably, the stress relieving member may be formed of any material selected from the group of copper, copper alloys, nickel, nickel alloys, iron or aluminum. The connection member may be lead frames 0.1 mm thick and 8 mm wide for example, which values allow the stress relieving member to have a thickness of 0.01 to 1 mm. The base member of aluminum nitride is preferably a sintered body. Further, the connection structure between components for a semiconductor apparatus preferably comprises a metallized layer formed on a junction surface of the base member. Preferably, the metallized layer contains at least a metal selected from tungsten and molybdenum, at least an aluminum compound selected from the group of aluminum nitride, aluminum oxide and aluminum oxynitride, and calcium oxide. A plated layer is preferably formed on a junction surface of the metallized layer to be connected with a solder material. A plated layer is also preferably formed on a surface of the connection member to be joined with the solder material.

Thus, if any soft metal or soft alloy is used as the stress relieving member between the base member of aluminum nitride and the connection member, the stress relieving member becomes further softened near a temperature for soldering and it becomes readily plastically deformable. As a result, most of the thermal stress caused by the difference in the thermal expansion coefficients of the aluminum nitride base member and the connection member is absorbed by the plastic deformation of the stress relieving member, whereby residual stress in the base member of aluminum nitride disappears. Consequently, a desired strength of soldering can be attained.

If a lead frame as the connection member is 0.1 mm thick and 8 mm wide, the thickness of the stress relieving member is preferably in the range from 0.01 to 1 mm. If the stress relieving member is less than 0.01 mm thick, it is too thin to allow a sufficient amount of plastic deformation and cannot absorb the thermal stress in a satisfactory manner. If the thickness of the stress relieving member is more than 1 mm, a thermal stress caused by the thermal expansion of the stress relieving member itself at the time of soldering cannot be disregarded. More specifically, even if the thermal stress caused by the difference between the thermal expansion coefficients of the lead frames and of the aluminum nitride base member can be absorbed by the plastic deformation of the stress relieving member, the considerably large thermal stress of the stress relieving member itself adversely affects the lead frames and the base member of aluminum nitride, resulting in a thermal strain in those members.

In addition, a metallized layer is preferably formed on the junction surface of the base member of aluminum nitride and if the metallized layer contains at least a metal selected from tungsten and molybdenum, at least an aluminum compound selected from aluminum nitride, aluminum oxide and aluminum oxynitride, and calcium oxide, a desired junction strength and thermal conductivity are achieved.

If a plated layer is formed on a surface of the metallized layer to be joined with solder material, a uniform and stable soldering can be applied thereto, because the wettability of the solder material and the metallized layer can be improved by the plated layer provided therebetween. The plated layer formed on the surface of the connection member to be joined with the solder member has also the same effect. These plated layers are formed preferably by nickel plating. Particularly, if a treatment such as gold plating is to be applied as an aftertreatment, it is preferred to apply a nickel plating for the purposes of improving the adhesion and deposition of the gold plating and forming a uniform gold plated layer on the nickel plating.

According to another aspect of the present invention a connection structure between components of a semiconductor apparatus comprises: a base member of aluminum nitride; a connection member including, as a main material, any of iron-nickel alloys and iron-nickel-cobalt alloys; and a solder material for joining the base member and the connection member, whereby the below described features are achieved. At least a surface of the connection member to be joined to the base member is made of an soft metal or soft alloys having a high plastic deformativity so that the surface of the connection member itself is deformed plastically to relieve the thermal stress caused by a difference between the thermal expansion coefficients of the base member and of the connection member. In the above described connection structure between components of a semiconductor apparatus, the junction face between the connection member and the base member is preferably formed of any material selected from copper, copper alloys, nickel, nickel alloys, iron and aluminum. The connection member preferably includes lead frames. Further, at least a portion of the connection member to be joined to the base member preferably includes an inner layer portion made of any iron-nickel alloys and iron-nickel-cobalt alloys, and an outer layer portion made of any of soft metals or soft alloys. In that case, the other portions of the connection member excluding the portion joined to the base member are preferably made of any material selected from iron-nickel alloys and iron-nickel-cobalt alloys.

In the above described connection structure, any soft metal or soft alloy forming the surface of the connection member joined to the base member of aluminum nitride, is plastically deformed to relieve the thermal stress caused by the difference between the thermal expansion coefficient of the base member of aluminum nitride and that of the connection member. Accordingly, if the base member of aluminum nitride and the connection member are soldered, the connection structure can provide a sufficiently high junction strength since the thermal stress caused therebetween has been relieved. Thus, the connection structure has a high reliability and a high resistance to thermal stress.

In the case of soldering the connection member to the base member of aluminum nitride, if at least the portion of the connection member joined to the base member includes an inner layer portion made of iron-nickel alloy or iron-nickel-cobalt alloy, and an outer layer portion formed of a soft metal or a soft alloy, the outer layer portion of the soft metal or the soft alloy to be joined to the base member of aluminum nitride, is plastically deformed to relieve the thermal stress caused between the base member of aluminum nitride and the connection member. In such a case, if the entire connection member has a three-layer structure including an inner layer portion and outer layer portions, the bending strength of the connection member itself is lowered, which may cause an inconvenience in practical use. For this reason, the connection member may be formed so that only the junction portion subjected to thermal stress has a three-layer structure and the other portions have a single-layer structure of iron-nickel alloy or iron-nickel-cobalt alloy to maintain a high bending strength. Further, if a two-layer composite structure is adopted in which a single stress relieving layer of a soft metal or a soft alloy is formed on a portion of the connection member such as a lead frame to be soldered, this two-layer composite structure has also an effect of relieving thermal stress. However, in this two-layer composite structure, warping or deformation may occur in the lead frames due to a bimetal effect at the time of soldering at a high temperature and voids could be easily generated in the junction portions between the lead frames and the base member of aluminum nitride. Thus, the junction strength of the connection member, such as the lead frames, cannot be uniform and the reliability of the connection structure itself is lowered.

For example, let us assume a case in which copper is selected as the soft metal material of the surface of the connection member joined to the base member, Kovar (trade name, i.e., Fe-29 wt. % Ni-17 wt. % Co) is selected as a main material of the connection member and a composite metal plate formed by combination of those materials is soldered to the base member of aluminum nitride by silver solder. In this case, copper is plastically deformed in a temperature range from the silver soldering temperature of 780° C. or a higher temperature by about 200° C., whereby the thermal stress caused between the Kovar and the base plate of aluminum nitride can be relieved. Although the thermal expansion coefficient of copper is as high as $18 \times 10^{-6} K^{-1}$, which value is considerably larger than that of aluminum nitride, it hardly causes residual strain due to thermal stress generated in the cooling process following the soldering, because copper has a high plastic deformability enabling it to be plastically deformed in the cooling process. In addition, if oxygen free copper is used as the copper for the junction surface, it has a particularly remarkable effect of relieving the thermal stress. Kovar as one of iron-nickel-cobalt alloys is selected as the main material of the connection member not only because it is industrially suited as the material for the lead frames and the like, but also because it has a thermal expansion coefficient close to that of aluminum nitride among the metal materials. The reason for forming the connection member such as the lead frame, as a composite metal plate, is that a lead frame made only of a soft metal material itself, has low tensile and bending strengths and it would involve a disadvantage in practical application.

The soft metal materials may be not only copper or copper alloys but also nickel, iron and aluminum metals or alloys thereof. However, if aluminum is used, the desired effect can be obtained only in the case of soldering it with a low melting solder material.

According to a further aspect of the present invention, a connection structure between components of a semiconductor apparatus comprises a protection cap for airtightly enclosing a semiconductor device mounted on an insulating base plate. The cap comprises a covering member made of aluminum nitride, a frame member made of any of iron-nickel alloys and iron-nickel-cobalt alloys, to be joined to the covering member to surround the semiconductor device located under the covering member, a stress relieving member, and a soldering material for joining the covering member, the stress relieving member and the frame member to one another. The stress relieving member is interposted between the covering member and the frame member and it is made of a soft metal or a soft alloy having a high plastic deformativity to relieve, by plastic deformation of itself, a thermal stress caused by a difference between the thermal expansion coefficient of the covering member and that of the frame member. The stress relieving member is preferably made of any of copper, copper alloys, nickel, nickel alloys, iron and aluminum.

The cap in accordance with the present invention comprises the covering member, the frame member and the soldering material and it has the below described features. A least a junction surface between the frame member and the covering member is made of a soft metal or a soft alloy having a high plastic deformability so that it is plastically deformed itself to relieve the thermal stress caused by the difference between the thermal expansion coefficient of the covering member and that of the frame member in a cooling process at the time of soldering. In this case, the junction surface is preferably made of copper, copper alloys, nickel, nickel alloys, iron or aluminum. At least a portion of the frame member to be joined to the covering member comprises an inner layer portion made of iron-nickel alloys or iron-nickel-cobalt alloys, and an outer layer portion made of any soft metal or soft alloys.

In the cap in accordance with the present invention, the stress relieving member interposed between the covering member and the frame member, or the soft metal material of the portion of the frame member to be joined to the covering member, is plastically deformed, so as to relieve a thermal stress caused by the difference between the thermal expansion coefficient of the covering member and that of the frame member in the cooling process at the time of soldering. Further, since the portion of the frame member to be joined to the covering member comprises an inner layer portion of iron-nickel alloy and an outer layer portion of a soft metal material, it becomes possible to suppress the generation of cracks in the covering member of aluminum nitride and to suppress the bimetal effect, whereby warping and deformation of the frame member can be reduced. Thus, the present invention makes it possible to provide a cap with a high dimensional precision or stability and a high reliability, ensuring good airtightness. Since the surface layer portion of the junction surface to be soldered is at least formed of a soft metal material, the soft metal material relieves the thermal stress applied to the junction surface and accordingly the junction strength between the respective members of the cap is sufficiently high, which also enhances the reliability.

For example, let us assume a case in which copper is selected as the soft metal material, Kovar (trade name) is selected as the main material of the frame member, and a three-layer composite metal plate formed by combination thereof, is soldered by a silver solder to the covering member of aluminum nitride. In this case, the copper is plastically deformed in a temperature range from the silver soldering temperature, i.e., 780° C. or a higher temperature by about 200° C., so as to relieve the thermal stress applied between the Kovar and the aluminum nitride. In this example, the materials of the respective members have the same function as described above with reference to the example of the connection structure between the lead frames and the base plate of aluminum nitride.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
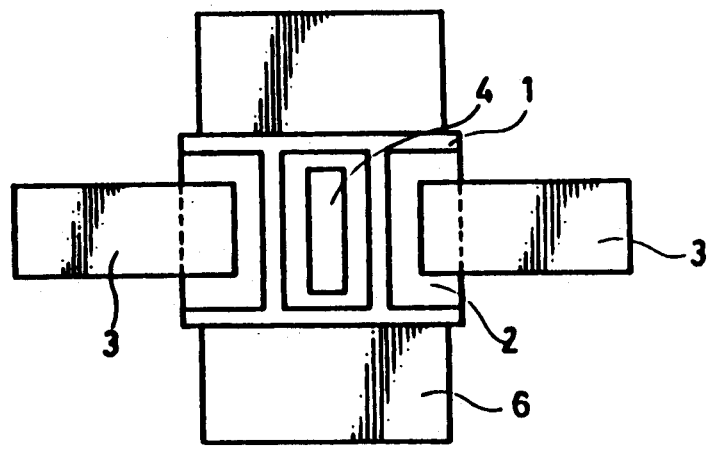
FIGS. 1A, 1B, and 1C are plan and sectional views showing a conventional structure between components for semiconductor apparatus, such as a connection structure between a alumina base plate and lead frames.

As described in the foregoing, the present invention relates to an improvement of a technique for forming a connection structure between components of a semiconductor apparatus, using a base member of aluminum nitride in the form of a sintered body obtained for example by the below described method.

The base member formed as a sintered body of aluminum nitride used in the present invention, includes preferably aluminum nitride as a major component and contains 0.01 to 1.0 wt. % of a element of the group IIIa in the periodic table and 0.001 to 0.5 wt. % of oxygen, and has a thermal conductivity higher than 180 $Wm^{-1}K^{-1}$. In forming the base member, first at least a compound containing a rare earth element is mixed with powder of aluminum nitride so that the compound containing the rare earth element, is present within the range of 0.01 to 1.0 wt. % evaluated by conversion of the rare earth element. Paraffin, PVB, PEG or the like is used as a shaping additive agent. Phenol resin or the like causing a residual carbon by decomposition, or carbon powder, graphite powder or the like may be added thereto so as to control the residual carbon in the sintered body. The rare earth compound is for example stearic acid, palmitic acid, alcoxide nitrate, carbonate or hydroxide. Preferably, a high polymer compound such as stearic acid is used. It is believed that such materials make it possible to decrease the content of the rare earth and to prepare mixture with aluminum nitride powder in good condition. Particularly, stearic acid is the most preferred in view of not only the function as the shaping additive but also the property of being mixed with aluminum nitride powder, the quantity of residual carbon, and the like. The aluminum nitride powder must be in the form of fine and uniform grains. The average grain diameter of the aluminum nitride powder is preferably 1 $\mu$m or less and the content of oxygen in the powder is preferably 2.0 wt. % or less. Such aluminum nitride powder cannot be easily obtained by a direct nitriding method (i.e., a method using nitrization of metal aluminum). It can be obtained by a reducing nitriding method (i.e., a method utilizing a reducing nitrization of aluminum oxide). If the direct nitriding method is adopted, it is necessary to pay particular attention to the control of the reaction, classification of the grain diameter and the like.

After the powder mixture has been shaped a desired form, it is sintered in a non-oxidizing atmosphere containing nitrogen. In order to make the sintered body have a high thermal conductivity, sintering is performed preferably at a temperature from 1000° to 2100° C. for more than five hours to cause an average grain diameter to be more than 5 μm. Cooling after the sintering is preferably performed rapidly. If the cooling is performed gradually, sintering additives are deposited and the sintered surfaces are considerably deteriorated. For this reason, the cooling is effected preferably down to 150° C. at a rate of 200° C./ hour.

A process for forming a metallized layer on a surface of the base member of the sintered body of aluminum nitride thus obtained is applied in the following manner.

First, the base plate of the sintered body of aluminum nitride is prepared by the above described method. As the material of the metallized layer, metal paste is prepared by mixing calcium compound powder, aluminum compound powder and metal powder of tungsten or molybdenum, and adding an organic binder such as "vehicle" thereto. Compositions of the metal paste are metal powder of 40 to 98 wt. %, aluminum compound of 1 to 25 wt. % and calcium oxide of 1 to 35 wt. %. In order to apply a sintering process as aftertreatment at a low temperature, copper or nickel may be added as catalyzer for lowering the sintering temperature. The metal paste thus prepared is coated on a major surface of the base plate formed of the sintered body of aluminum nitride. The base plate of the sintered body of aluminum nitride is fired in an inactive atmosphere of nitrogen or the like at a temperature from 1500° to 1800° C., whereby a metallized layer is formed on the surface of the base plate. If the metallized layer is formed to contain aluminum oxide of 1 to 10 wt. % as the aluminum compound and calcium oxide of 1 to 20 wt. % using tungsten powder as the metal powder, or if the metallized layer is formed to contain aluminum oxide of 1 to 10 wt. % as the aluminum compound and calcium oxide of 1 to 35 wt. % by using molybdenum powder as the metal powder, it is made possible to provide a connection structure with a desired adhesion strength between the base plate of the aluminum nitride sintered body and the metallized layer and having a good thermal conductivity.

The steps of forming a metallized layer on the surface of a base plate in the form of an aluminum nitride sintered body may be performed as follows, by sintering an aluminum nitride formed body coated with the metal paste at one time.

First, a base plate of the aluminum nitride formed body is prepared by shaping the aforementioned mixed powder into a prescribed configuration such as a green sheet. A material for the metallized layer is prepared by kneading powder of tungsten and at least one additive selected from a group of aluminum oxide, aluminum nitride, calcium oxide, yttrium oxide and stearic acid yttrium and the like, to provide a metal paste, similarly to the above. The metal paste thus provided is applied to the surface of the base plate formed by the aluminum nitride formed body, by printing or coating. The base plate formed by the aluminum nitride formed body is sintered with the metal paste similarly to the above conditions, to obtain a metallized layer on the surface of a base plate in the form of the aluminum nitride sintered body. Thus, the aluminum nitride sintered body with the metallized layer having high thermal conductivity is obtained.

Figure 3A:
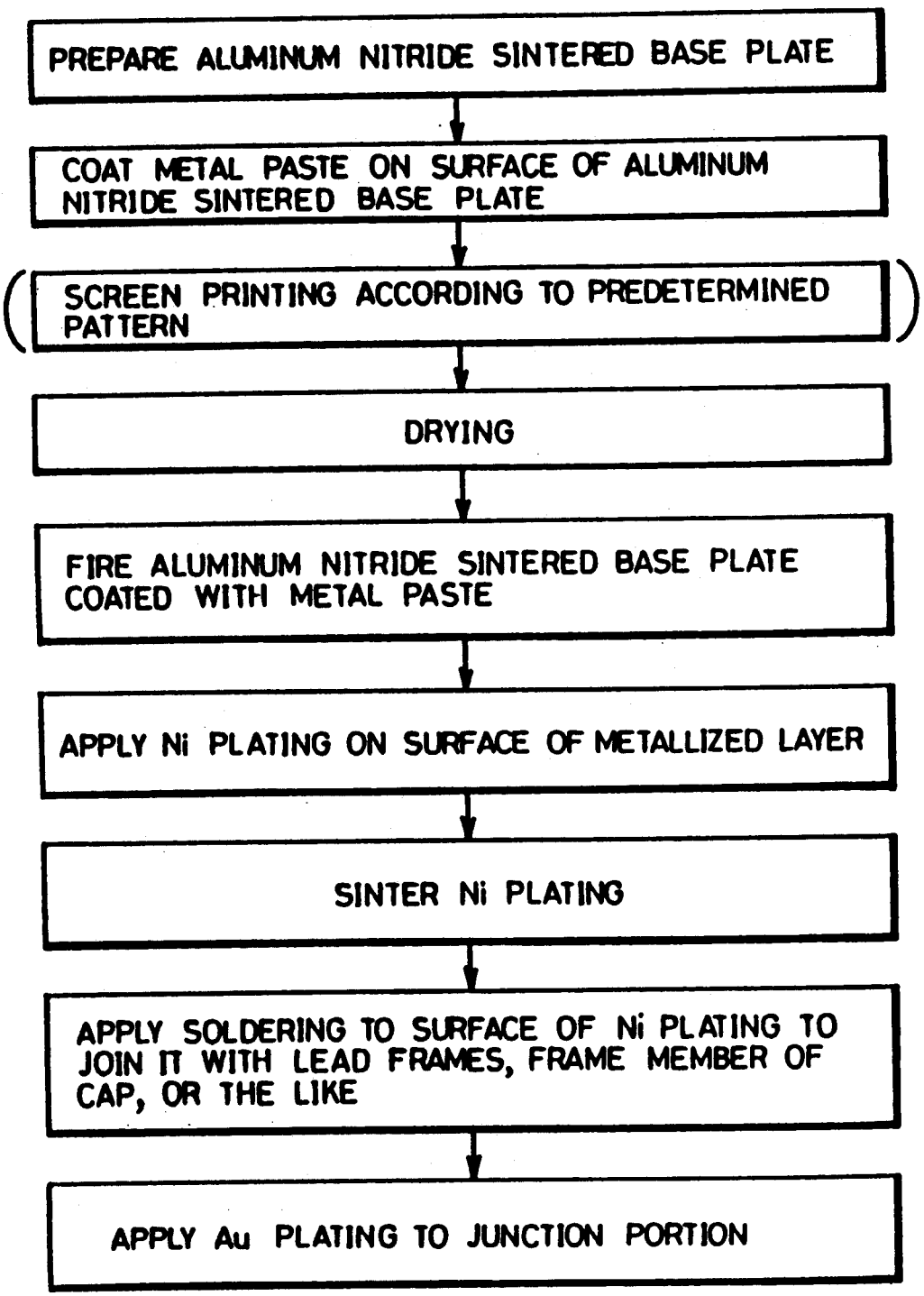
FIGS. 3A and 3B are process charts schematically showing two methods for fabricating a connection structure between components for a semiconductor apparatus in accordance with the present invention.
Figure 3B:
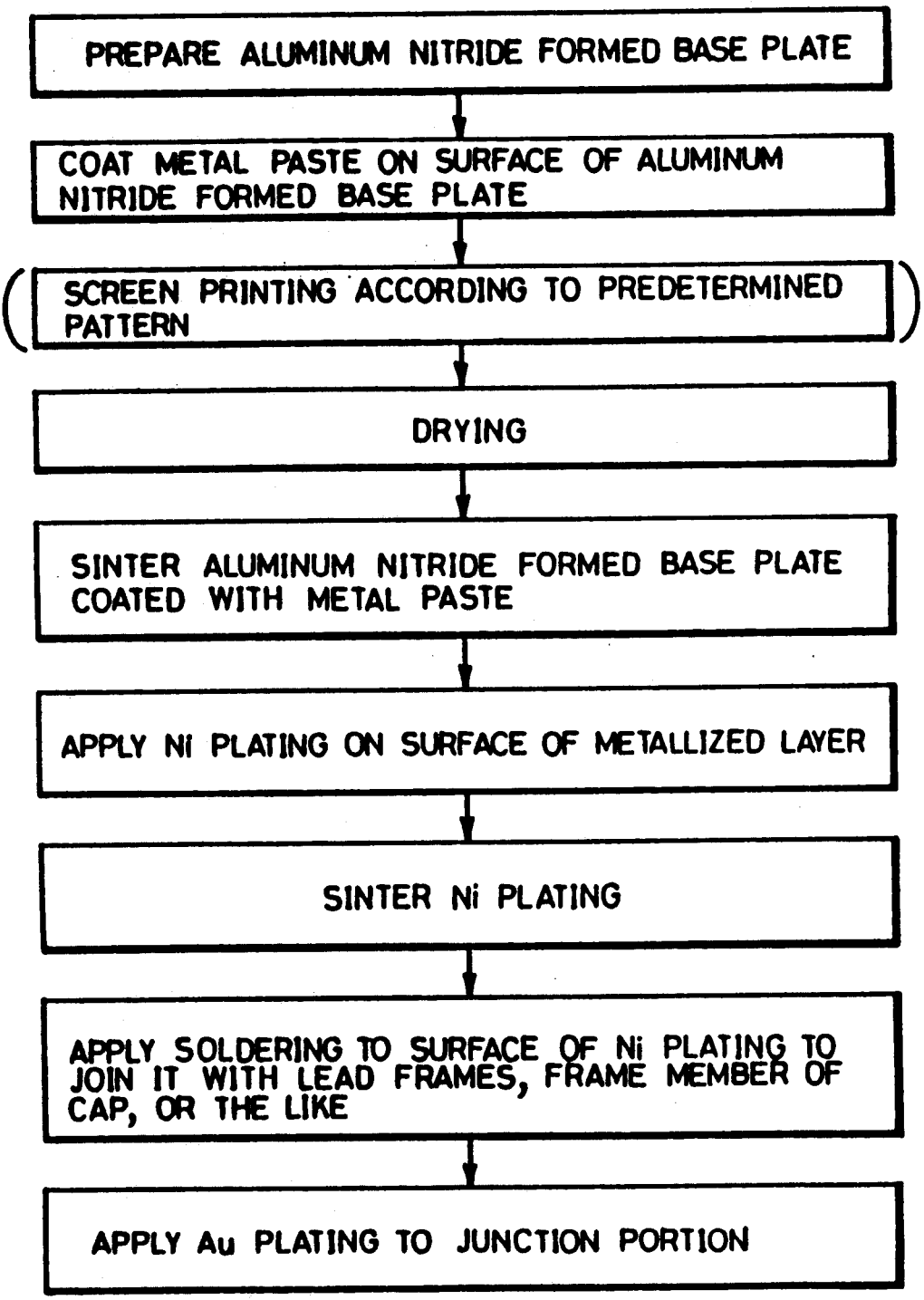

A typical example of a method for forming a connection structure between components of a semiconductor apparatus in accordance with the present invention will now be described. FIGS. 3A and 3B are process charts showing two methods for forming a connection structure between components of a semiconductor apparatus in accordance with the present invention. Referring to FIG. 3A, first, an aluminum nitride sintered base plate is prepared. Then, metal paste obtained by the above described method is coated on a surface of the aluminum nitride sintered base plate. A screen printing process may be applied to the coated metal paste in accordance with a predetermined pattern, e.g., a predetermined circuit pattern. After that, the screen printed metal paste is dried. The aluminum nitride sintered base plate is fired in an inactive gas atmosphere heated at a predetermined temperature.

The above steps may be performed as follows. Referring to FIG. 3B, an aluminum nitride formed base plate is first prepared. Then, the metal paste obtained through the aforementioned method is applied to the surface of the aluminum nitride formed base plate. Thereafter the metal paste thus applied is dried. Then the aluminum nitride formed base plate is sintered with the metal paste in an inert gas atmosphere which is heated to a prescribed temperature. Thus, an aluminum nitride sintered base plate with a metallized layer is formed.

After the firing/sintering, nickel plating is applied to a surface of a metallized layer formed on the aluminum nitride sintered base plate. A heat treatment is performed at a temperature of about 800° C. to improve the strength and airtightness of the nickel plating, so that the nickel plating is sintered. Then, soldering is applied to the surface of the nickel plating to join the aluminum nitride sintered base plate, the lead frames, the frame member for a cap and the like. Further, gold plating is applied to the junction portions. Thus, the connection structure in accordance with the present invention has been formed.

Figure 4A:
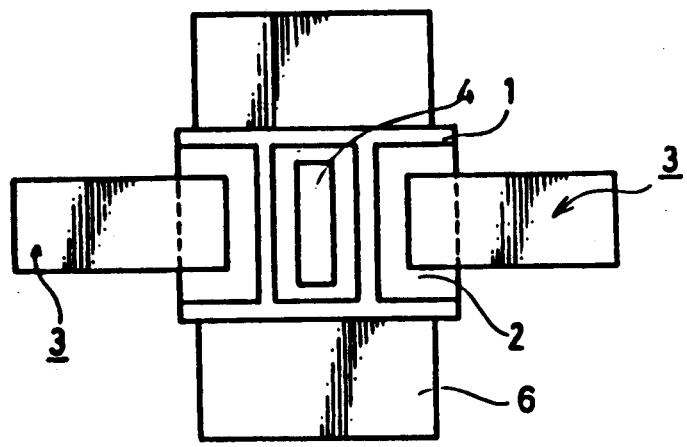
FIGS. 4A, 4B, and 4C are plan and sectional views showing a connection structure between components for a semiconductor apparatus in accordance with an embodiment of the present invention, e.g., a connection structure among lead frames, a stress relieving member and a base plate of aluminum nitride.
Figure 4B:
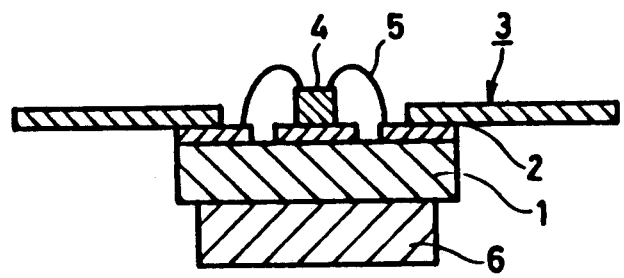
Figure 4C:
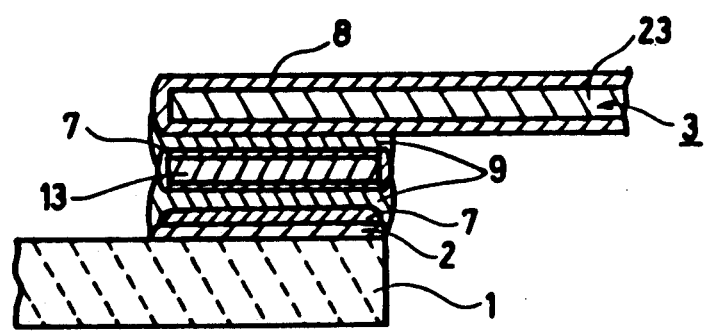

An embodiment of a thus formed connection structure between components of a semiconductor apparatus in accordance with an aspect of the present invention, for example, a junction structure of lead frames, stress relieving members and a base plate of aluminum nitride will be described with reference to the drawings. FIG. 4A is a plan view showing the embodiment of the invention used for the base plate for mounting the semiconductor apparatus; FIG. 4B is a sectional view thereof; and FIG. 4C is a detailed sectional view of a junction portion of the lead frame 3 and the base plate 1' of aluminum nitride.

Referring to the figures, this connection structure includes a metallized layer 2 formed by the above described process on specified regions of a major surface of the aluminum nitride sintered base plate 1', and lead frames 3 soldered to the metallized layer 2 by metal solder or the like. A stress relieving member 13 of a soft metal such as copper coated with a nickel plated layer is interposed between the metallized layer 2 and each lead frame 3. A semiconductor device 4 such as an FET involving a considerable heat generation, is mounted on a predetermined position of the aluminum nitride base plate 1'. The semiconductor device 4 is connected with the metallized layer 2 or the lead frames 3 by bonding wires 5. Further, a heat sink 6 of a tungsten alloy, e.g., a copper-tungsten alloy is attached to another surface of the aluminum nitride base plate 1', opposite to the aforementioned major surface. In addition, as shown in FIG. 4C, the junction portion between the aluminum nitride base plate 1' and each lead frame 3 further comprises a thin plated layer 7 formed on the metallized layer 2, and a plated layer 8 formed, as required, on outer surfaces of a metal layer 23 of Kovar or the like, to ensure wettability by the metal solder 9.

Figure 5A:
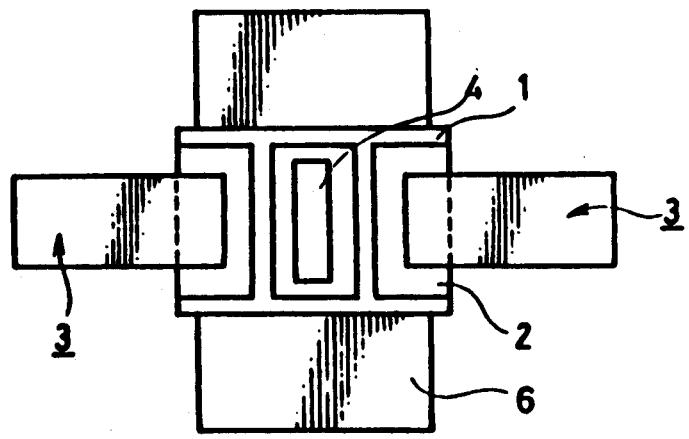
FIGS. 5A, 5B, and 5C are plan and sectional views showing a connection structure between components for a semiconductor apparatus in accordance with another embodiment of the present invention, e.g., a connection structure between lead frames of a composite metal plate and a base plate of aluminum nitride.
Figure 5B:
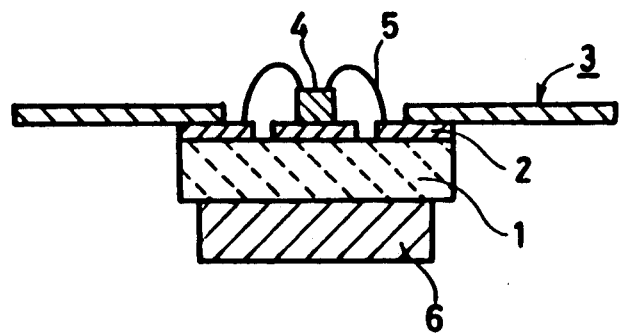

Another embodiment of a connection structure between components of a semiconductor apparatus in accordance with another aspect of the invention, e.g., a connection structure between lead frames having a stress relieving layer of a soft metal material and a metal layer of iron-nickel alloy and an aluminum nitride base plate will be described with reference t the drawings. As shown in FIGS. 5A and 5B, a metallized layer 2 is formed on specified regions of a surface of the aluminum nitride base plate 1' and lead frames 3 of a composite metal layer are joined to the metallized layer 2 by soldering with a metal solder or the like. Each of the lead frames has a stress relieving layer 13 of copper or the like and a metal layer 23 of Kovar or the like. A semiconductor device 4 such as an FET involving a considerable heat generation, is mounted in a predetermined position of the aluminum nitride base plate 1' and it is connected with the metallized layer 2 or the lead frames 3 of a composite metal plate by means of bonding wires 5. Further, a heat sink 6 is attached to another surface of the aluminum nitride base plate 1'.

Figure 5C:
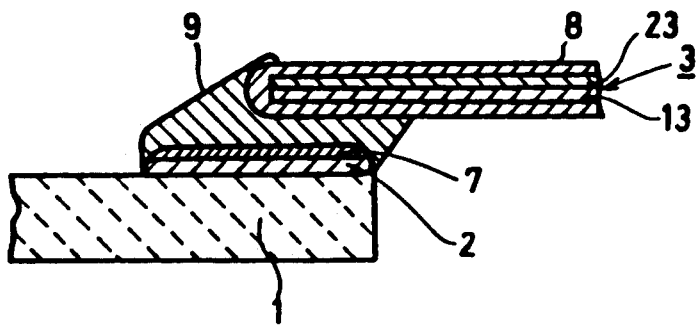

The metallized layer 2 may be the one conventionally used for soldering lead frames to an insulating base plate. For example, it may be formed by the above described steps of coating metal paste including tungsten or molybdenum as a major component on the aluminum nitride base plate and firing it together with the base plate, or it may be formed by a postmetallizing process, or it may be a thin film of titanium, chromium or nickel formed by vacuum evaporation or sputtering. The metal soldering material is preferably silver solder; however, it may be other solder material insofar as it can ensure a good junction between a metal material of a composite metal plate and a metallized layer by forming thin metal coated layers having good wettability with the solder material thereon. Even in the case of using silver solder, it is preferred, for example as shown in FIG. 5C, to form, as required, a thin nickel plated layer 7 on the metallized layer 2 if the metallized layer 2 includes tungsten as a major component and to form, as required, a nickel plated layer 8 on the surfaces of each lead frame 3 of a composite metal plate in advance thereby to ensure a stable wettability by the metal solder 9.

Figure 6A:
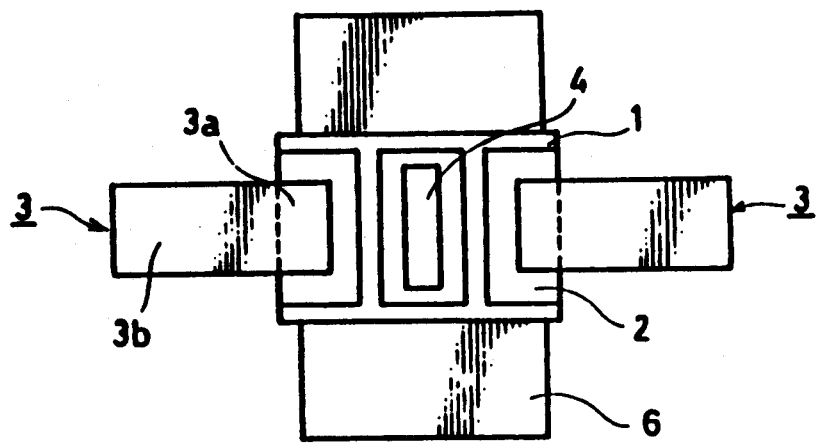
FIGS. 6A, 6B, 6CI, and 6CII are plan and sectional views showing a connection structure between components for a semiconductor apparatus in accordance with a further embodiment of the present invention, e.g., a connection structure between lead frames of a three-layer composite structure and a base plate of aluminum nitride.
Figure 6B:
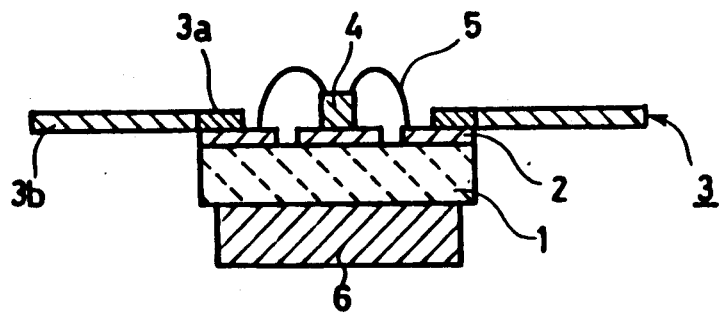
Figure 6C:
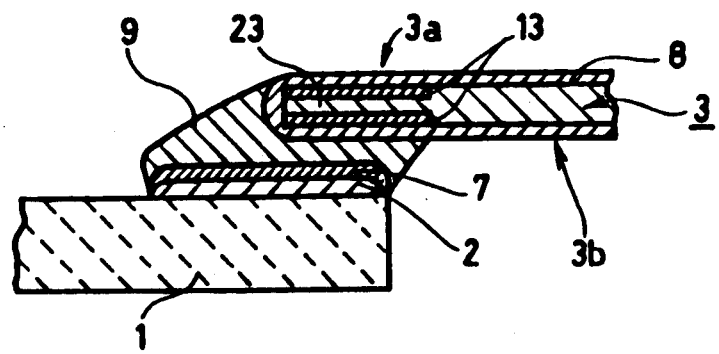

Another embodiment of a connection structure between components of a semiconductor apparatus in accordance with a further aspect of the present invention, e.g., a connection structure of lead frames having a three-layer composite structure and an aluminum nitride base plate will be described with reference to the drawings. As shown in FIGS. 6A to 6CII, in this connection structure, a metallized layer 2 is formed on specified regions of a major surface of the aluminum nitride base plate 1' and lead frames 3 each including a three-layer composite metal portion 3a and a single-layer metal portion 3b, or only a three-layer composite portion 3a, are joined to the metallized layer 2. Only the three-layer composite metal portions 3a of the lead frames 3 are joined to the metallized layer 2 by soldering with a metal solder 9. A semiconductor device 4 such as an FET involving a considerable heat generation, is mounted in a predetermined position on the aluminum nitride base plate 1' and it is connected with the metallized layer 2 or the lead frames 3 by bonding wires 5. Further, a heat sink 6 may be attached to another major surface of the aluminum nitride base plate 1' as required.

In addition, if each lead frame 3 includes a three-layer composite metal portion 3a and a single-layer metal portion 3b, a metal layer 23 of Kovar or the like out of the three layers, is formed of the same low expansion metal material as that of the single-layer metal portion 3b and stress relieving layers 13 on both sides of the metal layer 23 are formed of the same soft metal material, as shown in an enlarged view of FIG. 6CI. The three-layer composite metal portion 3a of the lead frame 3 can be formed in a manner in which the stress relieving layers 13 on both sides of the metal layer 23 to be soldered, are formed as clad materials by a cladding method. As shown in FIG. 6CI, both surfaces of the portion to be soldered in the lead frame 3, may be made thin and the stress relieving layers 13 may be formed on those surfaces to cause the three-layer composite metal portion 3a to have almost the same thickness a that of the single-layer metal portion 3b.

FIG. 6CII shows, in an enlarged view, another example of a lead frame 3 only formed of a three-layer composite metal portion 3a.

The method for forming the metallized layer 2 on the aluminum nitride base plate 1' may be a method conventionally used for soldering lead frames to an insulating base plate, or any of the above described methods such as the method for coating metal paste including tungsten, molybdenum or the like on an aluminum nitride base plate and firing the paste together with the base plate, or the method for forming a thin film of titanium, chromium or the like by vacuum evaporation or sputtering.

The metal soldering material is preferably a silver solder. However, it may be other metal soldering material insofar as it can ensure a good junction between the three-layer composite metal portion 3a of the lead frame 3 and the metallized layer 2 formed on the aluminum nitride base plate 1' by forming a thin coated layer of a metal having good wettability with the soldering material thereon. In addition, even in the case of using silver solder, if the metallized layer 2 includes tungsten as a major component, it is preferred to first form, before soldering as required, a thin plated layer 7 of nickel or the like on the metallized layer 2 and a plated layer 8 of nickel or the like on the surfaces of the three-layer composite metal portion 3a of each lead frame 3, to ensure a stable wettability for the metal solder 9. The plated layer may be formed on all the surfaces of each lead frame 3. In such a manner, adhesion and deposition of gold plating or the like applied by an aftertreatment can be improved and thus a uniform plated layer of gold or the like can be formed.

Figure 7:
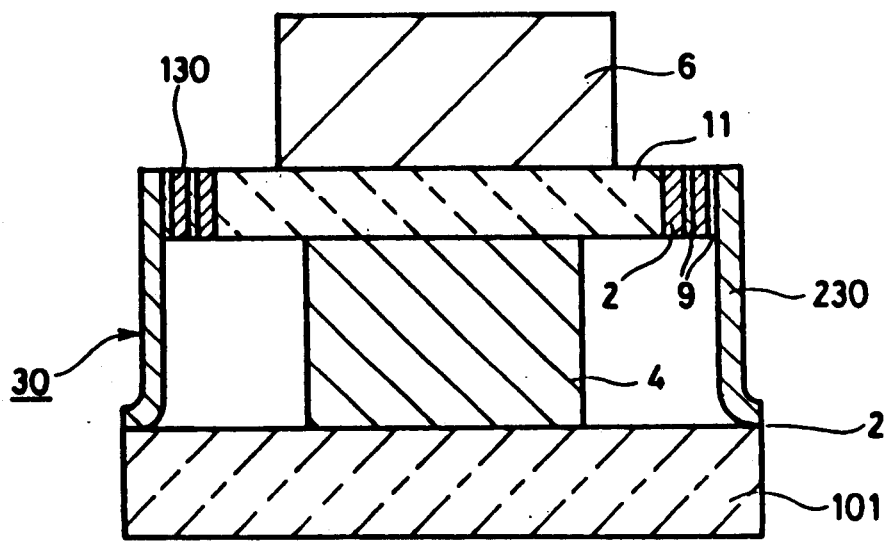
FIG. 7 is a sectional view showing a further embodiment of the invention in which a connection structure between components for a semiconductor apparatus, is applied to a cap.

A description is now made of a cap to which a connection structure between components of a semiconductor apparatus in accordance with the present invention is applied, with reference to FIG. 7 showing an embodiment of the cap structure. A metallized layer 2 is formed on peripheral side surfaces of a covering member 11 formed as a sintered body of aluminum nitride. This metallized layer 2 is joined to a frame member 30 formed only of a metal layer 230 of an iron-nickel alloy by the metal solder 9 through a stress relieving member 130 of copper or the like. The lower end of the frame member 30 is joined to a ceramic base plate 101 through another metallized layer 2. A semiconductor device 4 is mounted on the ceramic base plate 101. A heat sink 6 is provided on an upper surface of the covering member 11, so that heat generated by the semiconductor device 4 is dissipated by the heat sink 6 through the covering member 11, and thus the cooling effect is enhanced. The metallized layers 2 are the same as those described above concerning the connection structure between the lead frames and the aluminum nitride base plate. The metal solder 9 to be used is preferably silver solder; however, it may be other soldering material insofar as it can ensure a good junction between the related surfaces of the frame member 30 and the metallized layers 2 by forming thin coated films of a metal having a good wettability with the soldering material thereon. Those thin layers have the same function as described above with regard to the embodiment of the connection structure between the lead frames and the aluminum nitride base plate.

Figure 8:
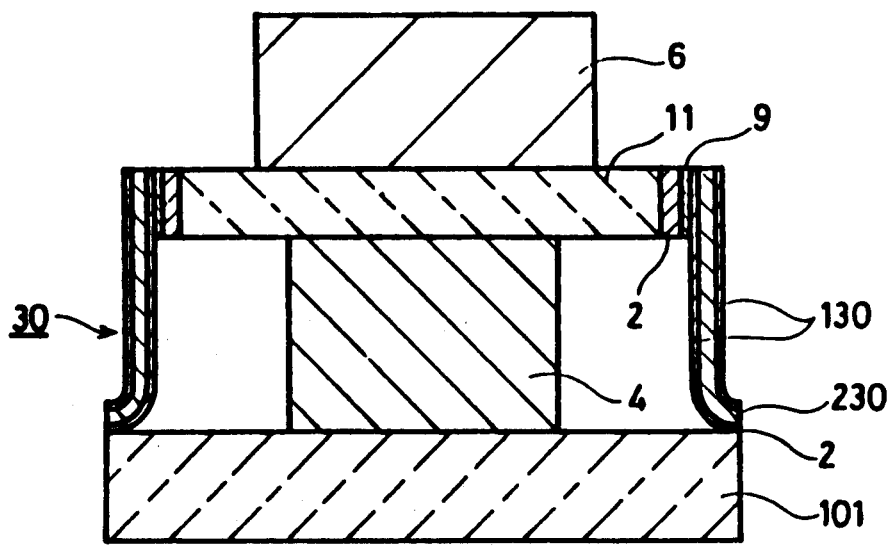
FIG. 8 is a sectional view showing a still further embodiment of the invention in which a connection structure between components for a semiconductor apparatus, is applied to a cap.

FIG. 8 is a sectional view of another embodiment in which a connection structure between components for a semiconductor apparatus in accordance with the present invention is applied to a cap. According to FIG. 8, a metallized layer 2 is formed on peripheral side surfaces of a covering member 11 formed as a sintered body of aluminum nitride. A frame member 30 of a three-layer composite metal plate is joined to the metallized layer 2 by the metal solder 9. The frame member 30 has a composite structure including a metal layer 230 of a low expansion metal material such as Kovar and stress relieving layers 130 of a soft metal material such as copper, formed on both surfaces of the metal layer 230. The lower end of the frame member 30 is joined to a ceramic base plate 101 through another metallized layer 2. A semiconductor device 4 is mounted on the ceramic base plate 101. Further a heat sink 6 is provided on an upper surface of the covering member 11, to dissipate heat generated by the semiconductor device 4 through the covering member 11 and thus the cooling effect is enhanced. The metallized layers 2 and the metal solder 9 are the same as described above. In addition, a thin plated layer may be formed on the frame member 30 or on the junction surfaces of the metallized layers 2. The function of such thin plated layer is the same as described above.

The following description is made of examples A to E using samples prepared with base members in the form of an aluminum nitride sintered body obtained by the above described method in accordance with the invention.

EXAMPLE A

A metallizing process was applied to a base plate in the form of an aluminum nitride sintered body obtained by the above described method. The metallizing process was applied by the steps of coating a metal paste having a predetermined composition, on a surface of each sample of an aluminum nitride sintered base plate, applying a debinding agent thereto and then firing the base plate coated with the metal paste, in a nitrogen atmosphere at a temperature of 1600° C. for 60 minutes.

As a result, a metallized layer was formed on predetermined regions of the aluminum nitride sintered base plate. The metal paste used in this case was prepared by adding calcium oxide powder and alumina powder to tungsten powder and mixing the powders with an organic binder such as a "vehicle". The amount of calcium oxide powder added was 14 wt. % and that of alumina powder was 4 wt. %.

Figure 9:
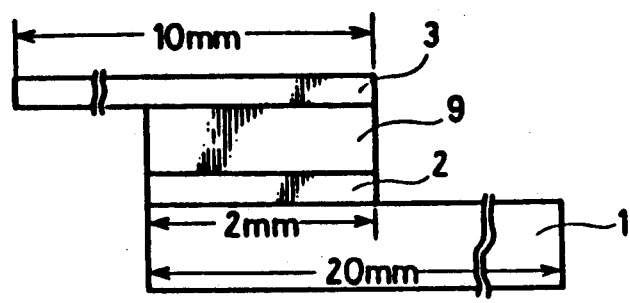
FIG. 9 is a side view showing a dimensional relation in an example of a connection structure between a lead frame and a base plate of aluminum nitride.

Further, a nickel plated layer of 2 μm in thickness was formed on the surface of the metallized layer. Then, as shown in FIG. 4C, a stress relieving member was interposed between each lead frame and the aluminum nitride sintered base plate and silver soldering was applied thereto at a temperature of 830° C. A dimensional relation in the junction between the aluminum nitride base plate and the lead frame, is shown in FIG. 9. A lead frame 3 having a width of 8 mm and a length of 10 mm was joined to the aluminum nitride base plate 1' having a length of 20 mm, by the silver solder 9. The junction area between the lead frame 3 and the aluminum nitride base plate 1' was 2 mm × 8 mm. In order to evaluate a junction strength between the lead frame and the aluminum nitride base plate, tensile tests were carried out by pulling the lead frames 3 in the direction shown by the arrow, so as to measure the soldering strength. The results are shown in Table 1. More specifically, the soldering strength for each sample in Table 1 is an average value obtained based on five measured values. For comparison, an example of a junction between lead frames and a beryllia base plate is shown in Table 1 (as the sample No. 10).

According to Table 1, the soldering strengths of the samples not using any stress relieving member, were extremely low, i.e., 0.5 to 2 kg. In the case of the samples not using the stress relieving members, the starting point of breaking existing in each aluminum nitride base plate and cracks due to thermal stress were visible. In the case of the samples using stress relieving members for the junction between the lead frames and the aluminum nitride base plate in accordance with the present invention, it was found that a desired soldering strength can be obtained if the thickness of the stress relieving member is in the range from 0.01 to 1 mm with the lead frames having a thickness of 0.1 mm and a width of 8 mm.

In addition, after a metallized layer having the above described composition was formed on specified regions of the surface of each sample of the aluminum nitride base plate, a nickel plated layer of 2 to 3 μm in thickness and a gold plated layer of 2 to 3 μm in thickness were formed thereon. After that, a high power FET was soldered to the surface of the plated layer by a solder material of gold-silicon. Then, by using a method of $\Delta V_{BD}$, a change amount $\Delta V_{BE}$ caused by application of a forward drop voltage $V_{BE}$ between the emitter and the base of the transistor was measured and a thermal resistance of the unit including the transistor and the aluminum nitride base plate, was evaluated. The measured thermal resistance values of all the samples were less than 1.9° C./W. Consequently, it is understood that the aluminum nitride base plate is suited as a base plate on which a semiconductor device is to be mounted, from a view point of thermal conductivity.

TABLE 1

| No. | Lead Frame | Stress Relieving Member | Soldering strength (kg) |
|---|---|---|---|
| 1 | Kovar (t = 0.05 mm) | 4 μm Ni-plated Cu (t = 0.1 mm) | 13 |
| 2 | " | 4 μm Ni-plated Cu (t = 0.05 mm) | 11 |
| 3 | " | not provided | 1.3 |
| 4 | Kovar (t = 0.1 mm) | 4 μm Ni-plated Cu (t = 0.1 mm) | 13 |
| 5 | " | 4 μm Ni-plated Cu (t = 0.05 mm) | 12 |
| 6 | " | 4 μm Ni-plated Cu (t = 0.02 mm) | 9 |
| 7 | " | 4 μm Ni-plated Cu (t = 0.005 mm) | 4.5 |
| 8 | " | 4 μm Ni-plated Cu (t = 1.5 mm) | 0.8 |
| 9 | " | not provided | 1.5 |
| 10* | " | not provided | 5.5 |
| 11 | Kovar (t = 0.2 mm) | 4 μm Ni-plated Cu (t = 0.2 mm) | 10 |
| 12 | " | 4 μm Ni-plated Cu (t = 0.1 mm) | 8.5 |
| 13 | " | not provided | 1.2 |
| 14 | Kovar (t = 0.07 mm) | Cu (t = 0.1 mm) | 14 |
| 15 | " | Cu (t = 0.05 mm) | 12.5 |
| 16 | " | Cu (t = 0.03 mm) | 11 |
| 17 | " | not provided | 2 |
| 18 | Kovar (t = 0.1 mm) | Cu t = 0.1 mm) | 11 |
| 19 | " | Cu (t = 0.05 mm) | 8 |
| 20 | Kovar (t = 1.4 mm) | Cu (t = 0.01–1.0 mm) | 1.5 |
| 21 | " | not provided | 1.5 |
| 22 | Kovar (t = 0.1 mm) | Ni (t = 0.1 mm) | 7 |
| 23 | " | Ni (t = 0.05 mm) | 5 |
| 24 | Fe—Ni 42 alloy (t = 0.1 mm) | 4 μm Ni-plated Cu (t = 0.1 mm) | 10.5 |
| 25 | Fe—Ni 42 alloy (t = 0.1 mm) | 4 μm Ni-plated Cu (t = 0.05 mm) | 9 |
| 26 | Fe—Ni 42 alloy (t = 0.1 mm) | not provided | 1 |
| 27 | Fe—Ni 42 alloy (t = 0.2 mm) | 4 μm Ni-plated Cu (t = 0.2 mm) | 8.3 |
| 28 | Fe—Ni 42 alloy (t = 0.2 mm) | 4 μm Ni-plated Cu (t = 0.1 mm) | 7.3 |
| 29 | Fe—Ni 42 alloy (t = 0.2 mm) | not provided | 1 |
| 30 | Fe—Ni 42 alloy (t = 0.07 mm) | Cu (t = 0.03 mm) | 9.5 |
| 31 | Fe—Ni 42 alloy (t = 0.07 mm) | not provided | 2 |
| 32 | Fe—Ni 42 alloy (t = 0.1 mm) | Ni (t = 0.1 mm) | 8.5 |
| 33 | Fe—Ni 42 alloy (t = 0.1 mm) | Ni (t = 0.05 mm) | 7 |

*BeO base plate

EXAMPLE B

A metallized layer was formed on specified regions of a surface of a base plate formed as an aluminum nitride sintered body, by the following metallization processing. The metallization processing of samples was performed by applying tungsten paste of a prescribed composition to the surfaces of respective samples of the aluminum formed base plates shaped in a configuration such as a green sheet, by the aforementioned method with screen printing of prescribed patterns, drying, performing debindering and then sintering the same in a nitrogen atmosphere at a temperature of 1850° C. for 5 hours. Thus, metallized layers were formed on prescribed portions of aluminum nitride sintered base plates. Nickel plating layers of 2 μm in thickness were formed on the metallized layers, and sintered in a hydrogen atmosphere at a temperature of 750° C. for 20 minutes. Lead frames were joined on the metallized layer in the same manner as in the example A, whereby samples were prepared. The junction strength between the lead frames and the base plate of each sample was evaluated in the same manner as in the example A. The results are shown in Table 2.

From Table 2 it is found that the soldering strengths of the samples not using any stress relieving member were as low as 0.5 to 2 kg. The starting point of breaking of each of such samples existing in the aluminum nitride base plate and cracks due to thermal stress were found for each of such samples

TABLE 2

| No. | Lead Frame | Stress Relieving Member | Soldering Strength (kg) |
|---|---|---|---|
| 1 | Kovar (t = 0.1 mm) | 4 μm Ni-plated Cu (t = 0.1 mm) | 13.5 |
| 2 | " | 4 μm Ni-plated Cu (t = 0.05 mm) | 10.5 |
| 3 | " | Cu (t = 0.1 mm) | 13 |
| 4 | " | Cu (t = 0.05 mm) | 10.5 |
| 5 | " | Ni = 0.1 mm) | 9.5 |
| 6 | " | Ni (t = 0.05 mm) | 7 |
| 7 | " | not provided | 1.5 |
| 8 | Fe—Ni 42 alloy (t = 0.1 mm) | 4 μm Ni-plated Cu (1 = 0.1 mm) | 14 |
| 9 | Fe—Ni 42 alloy (t = 0.1 mm) | 4 μm Ni-plated Cu (t = 0.05 mm) | 10.5 |

TABLE 2-continued

| No. | Lead Frame | Stress Relieving Member | Soldering Strength (kg) |
|---|---|---|---|
| 10 | Fe—Ni 42 alloy (t = 0.1 mm) | Cu (t = 0.1 mm) | 12 |
| 11 | Fe—Ni 42 alloy (t = 0.1 mm) | Cu (t = 0.05 mm) | 10.5 |
| 12 | Fe—Ni 42 alloy (t = 0.1 mm) | Ni (t = 0.1 mm) | 8.5 |
| 13 | Fe—Ni 42 alloy (t = 0.1 mm) | Ni (t = 0.05 mm) | 7 |
| 14 | Fe—Ni 42 alloy (t = 0.1 mm) | not provided | 1.5 |

EXAMPLE C

Lead frames were soldered without interposition of a stress relieving member, by silver solder at a temperature of about 830° C. to be joined onto a metallized layer including tungsten as a major component formed on a surface of an aluminum nitride base plate. In this case, the lead frames used had the shape shown in FIG. 9 having a thickness of 0.1 mm. As shown in FIG. 5C or 6C, the junction portion of each lead frame was formed as a three-layer composite metal portion, or a two-layer composite metal portion, the composition thereof being shown in Table 3, and each lead frame had the same uniform thickness. The junction strength between the lead frames and the aluminum nitride base plate of each of ten samples prepared, was measured in the same manner as in the Example A. The results of the measurement of the junction strength are shown in Table 3 which indicates ranges of the different measured values of the ten samples.

As is evident from Table 3, in the case of using lead frames having three-layer composite metal portions and two layer composite metal portions for forming a junction with the respective aluminum nitride base plates, the junction strengths were remarkably improved compared with the cases of using conventional lead frames formed of only Kovar or 42-alloy. It is further understood that in the cases of using lead frames having three-layer composite metal portions, the ranges of difference in the junction strength were smaller to those in the cases of using lead frames having two-layer composite metal portions.

Further, bending strength tests were conducted with a time duration required for a free end of a lead frame to be bent at right angles and to be restored to the initial state, defined as "one cycle". As a result, as for the lead frames having three-layer composite metal portions and the conventional lead frames formed of only Kovar or 42-alloy, more than 24 cycles were required until they were broken. On the other hand, the lead frames entirely formed of a two-layer composite metal portion were broken by 5 to 10 cycles and the lead frames formed of only a soft metal material were broken by 2 to 6 cycles.

TABLE 3

| No. | Stress Relieving Layer on Soldered Surface (μm) | Central Metal Layer (μm) | Stress Relieving Layer on Opposite Surface (μm) | Junction Strength (kg) | Breakage |
|---|---|---|---|---|---|
| 1 | Cu (20) | Kovar (60) | Cu (20) | 9.4~10.8 | In Lead Frame |
| 2 | Cu (40) | Kovar (60) | none | 2.4~10.1 | In Lead Frame |
| 3 | Cu (30) | 42 Alloy (40) | Cu (30) | 7.6–9.9 | In Lead Frame |
| 4 | Cu (40) | 42 Alloy (60) | none | ~7.1 | In Lead Frame |
| 5 | Fe (20) | Kovar (60) | Fe (20) | 5.6~7.7 | In Lead Frame |
| 6 | Ni (20) | Kovar (60) | Ni (20) | 6.0~6.9 | In Lead Frame |
| 7 | Fe (40) | 42 Alloy (60) | none | 3.1~5.8 | In Lead Frame |
| 8 | Ni (40) | 42 Alloy (60) | none | 5.2~6.1 | In Lead Frame |
| 9 |  | Kovar (100) |  | 0.9~1.4 | In AlN |
| 10 |  | 42 Alloy (100) |  | 0.8~1.1 | " |

Values in ( ) represent thickness of the respective layers.

EXAMPLE D

In the same manner as in the Example C, lead frames having the same shape and the same thickness of 0.1 mm, were joined to an aluminum nitride base plate by soldering as shown in FIG. 9. Each lead frame was prepared to have a portion to be soldered including a three-layer composite metal portion, or a two-layer composite metal portion as shown in Table 4. Each lead frame was joined to a metallized layer including tungsten as a major component formed on specified regions of a surface of the aluminum nitride base plate as in the Example A, by a soldering process at a temperature within the range of 450° to 600° C. using a low melting metal soldering material having a composition of gold-silicon, gold-silver-germanium or the like. The junction strength was measured in the same manner as in the Example A with regard to ten samples of each kind thus obtained. The results of the measurement of the junction strength are shown in Table 4, which indicates the differences within the range of measured values.

As can be seen from Table 4, in the cases of using lead frames having three-layer composite metal portions and lead frames having two-layer composite metal portions, the junction strengths were remarkably improved compared with the conventional lead frames formed of only Kovar or 42-alloy. It is further understood that in the cases of using the lead frames having the three-layer composite metal portions, the differences in the junction strength were small.

TABLE 4

| No. | Stress Relieving Layer on Soldered Surface (μm) | Central Metal Layer (μm) | Stress Relieving Layer on Opposite Surface (μm) | Junction Strength (kg) | Breakage |
|---|---|---|---|---|---|
| 1 | Cu (30) | Kovar (40) | Cu (30) | 9.4~10.8 | In Lead Frame |
| 2 | Cu (40) | Kovar (60) | none | 1.9~10.1 | " |
| 3 | Cu (20) | 42 Alloy (60) | Cu (20) | 8.6~10.2 | " |
| 4 | Cu (40) | 42 Alloy (60) | none | ~8.0 | " |
| 5 | Fe (20) | Kovar (60) | Fe (20) | 8.9~11.0 | " |
| 6 | Fe (40) | 42 Alloy (60) | none | 2.4~7.6 | " |
| 7 | Ni (20) | Kovar (60) | Ni (20) | 6.5~8.1 | " |
| 8 | Ni (40) | 42 Alloy (60) | none | 1.0~7.1 | " |
| 9 | Al (20) | Kovar (60) | Al (20) | 10.1~11.4 | " |
| 10 | Al (40) | Kovar (60) | none | 11.2~12.2 | " |
| 11 | Al (20) | 42 Alloy (60) | Al (20) | 9.2~10.8 | " |
| 12 | Al (40) | 42 Alloy (60) | none | 8.8~11.0 | " |
| 13 | | Kovar (100) | | 1.6 | In AlN |
| 14 | | 42 Alloy (100) | | 1.8 | " |

Values () represent thickness of the respective layers.

EXAMPLE E

Figure 11:
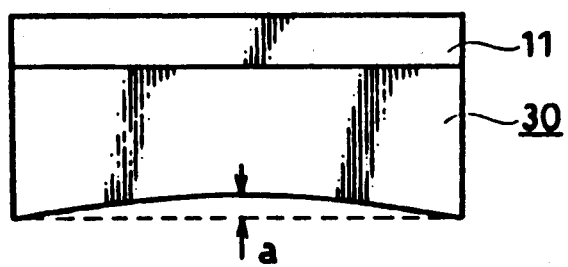
FIG. 11 shows the measuring of a warping in a frame member such as a cap.
Figure 12:
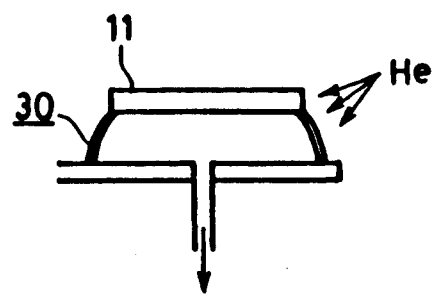
FIG. 12 is an illustration for explaining a test method for measuring the airtightness of the cap of FIG. 11.
Figure 1A:
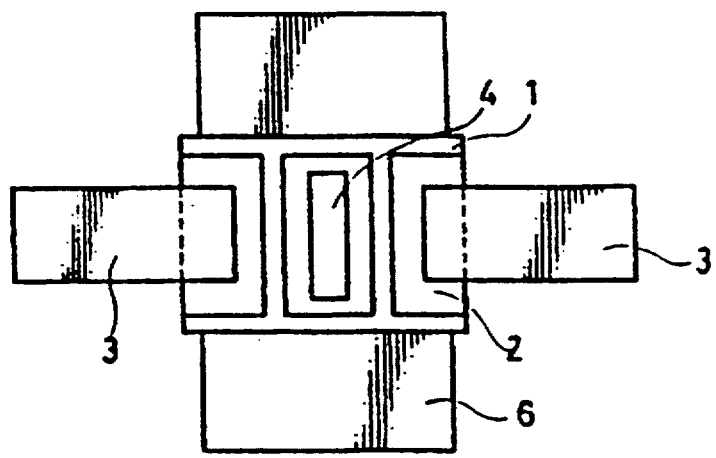
Figure 1B:
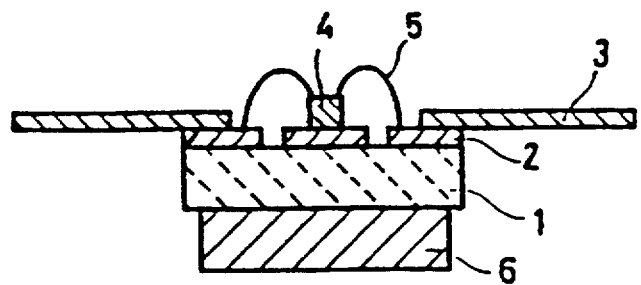
Figure 1C:
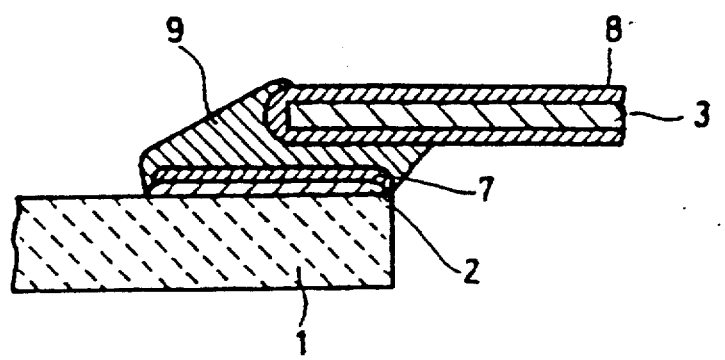
Figure 2A:
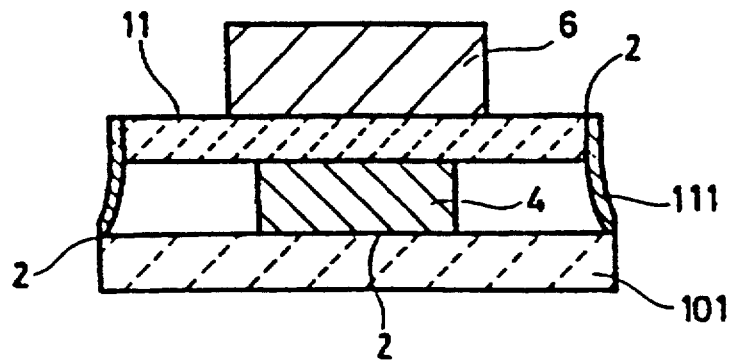
Figure 2B:
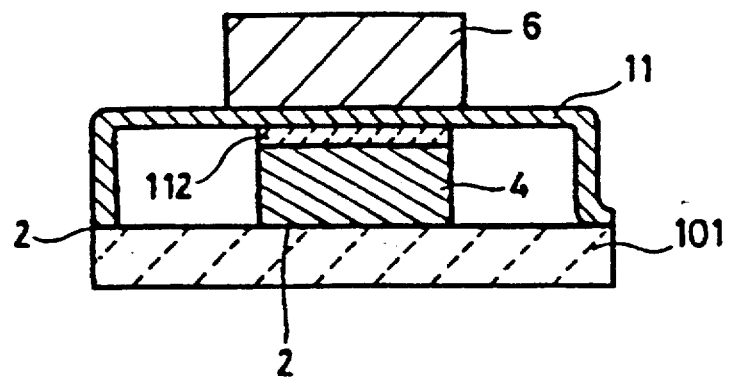
Figure 3A:
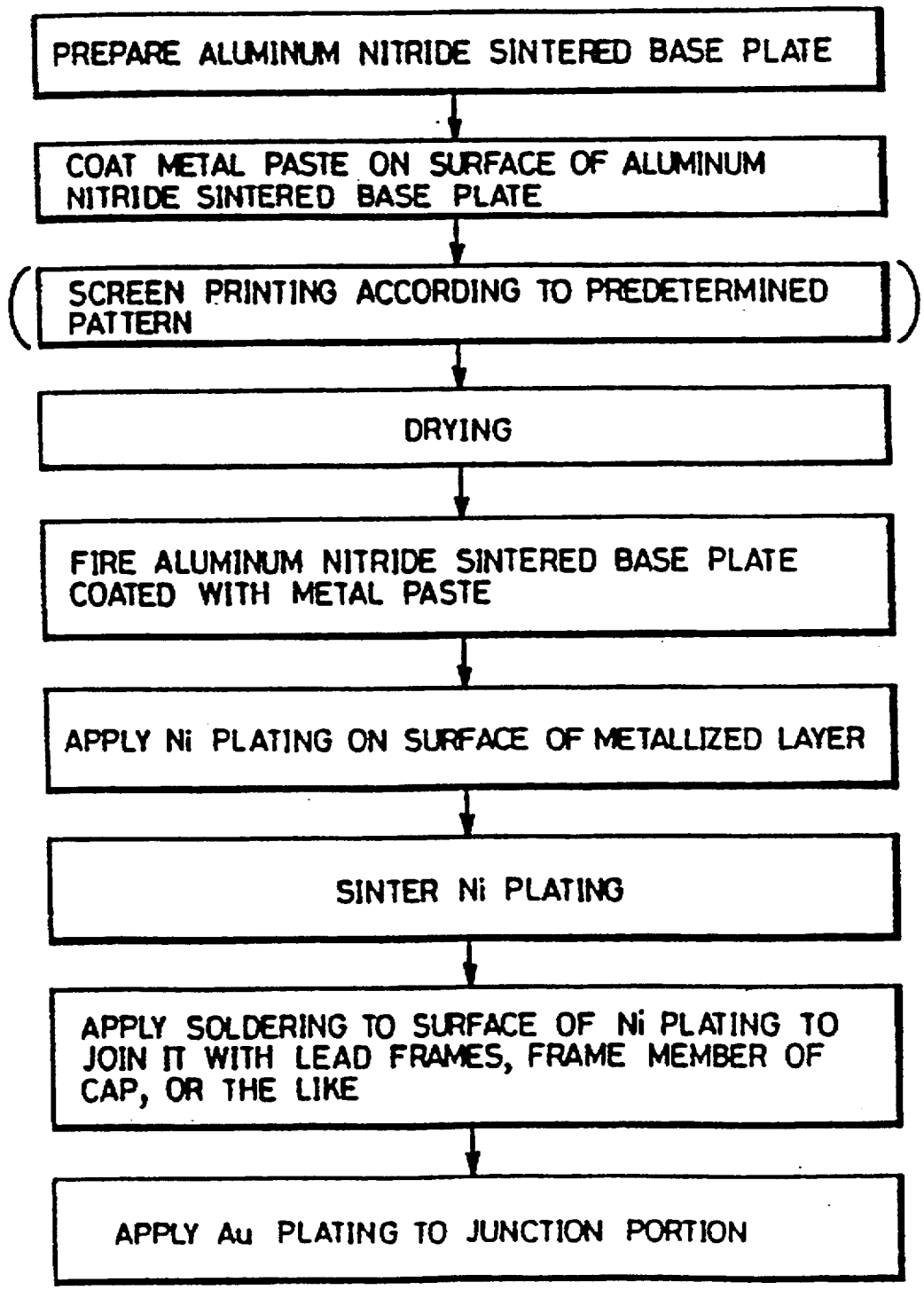
Figure 3B:
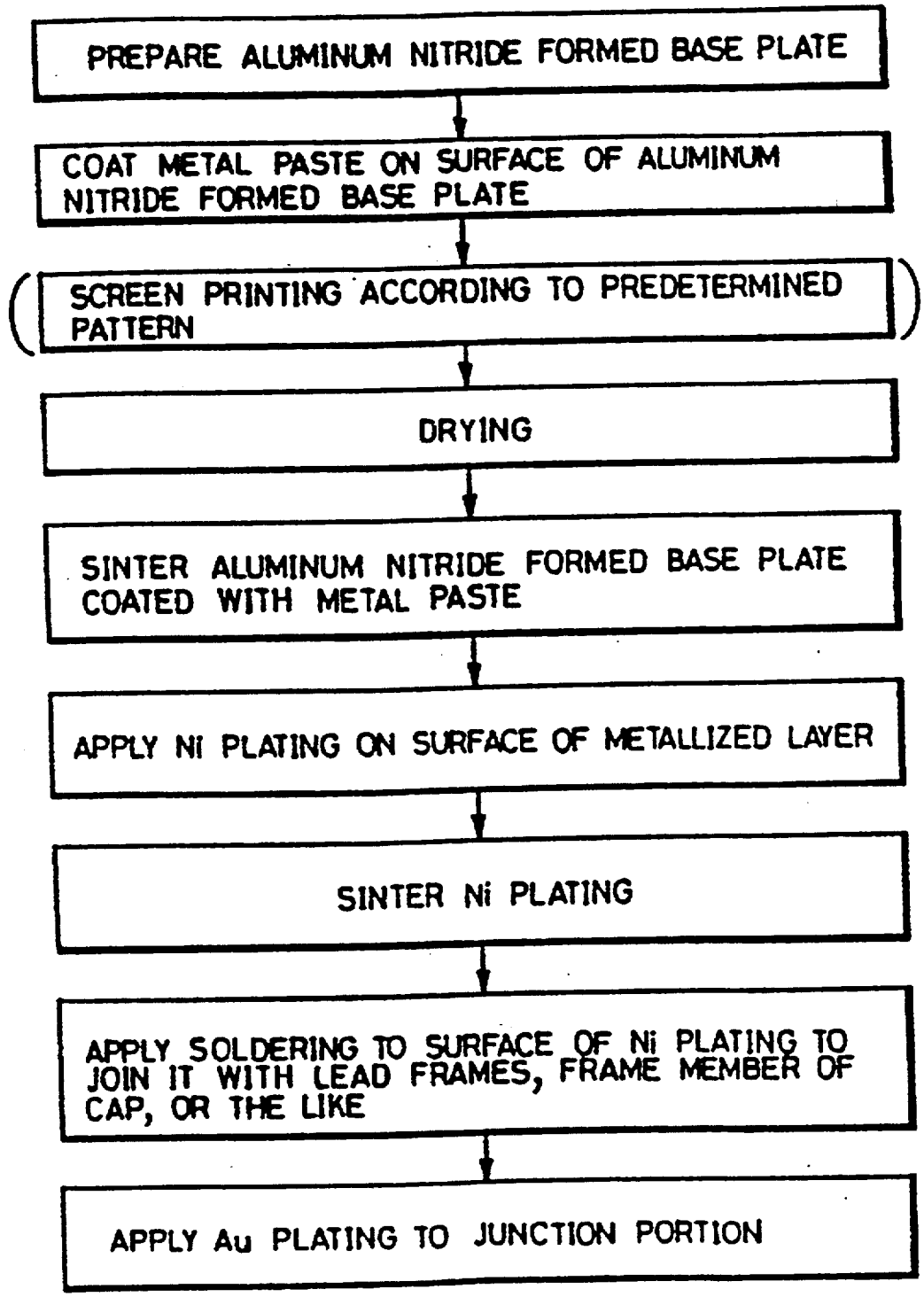
Figure 4A:
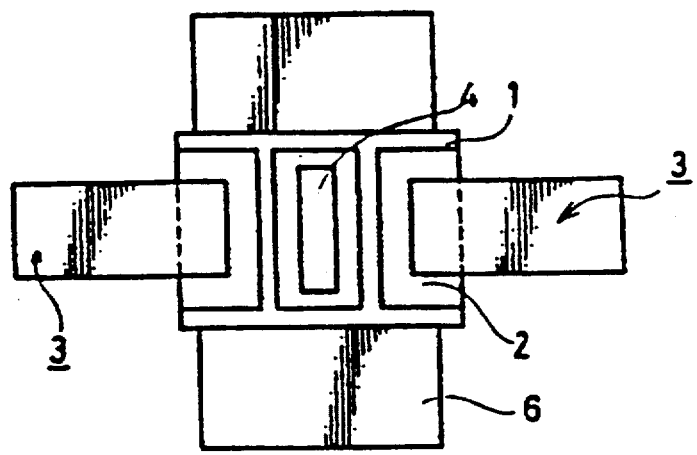
Figure 4B:
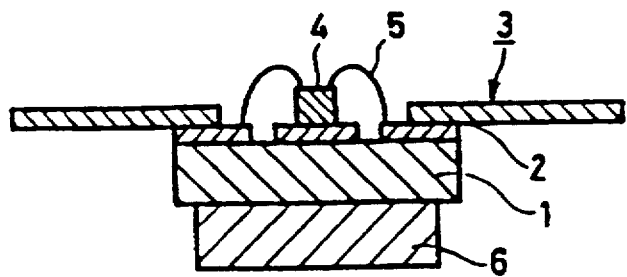
Figure 4C:
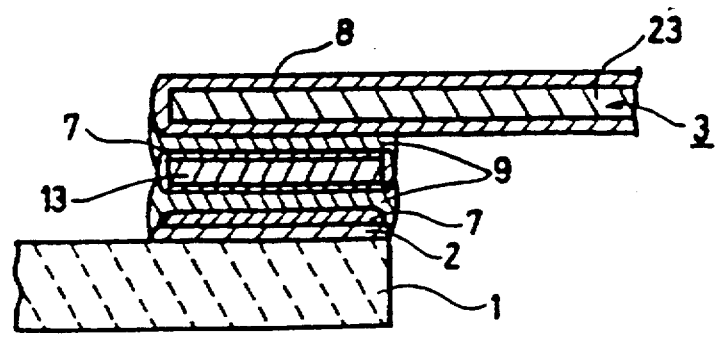
Figure 5A:
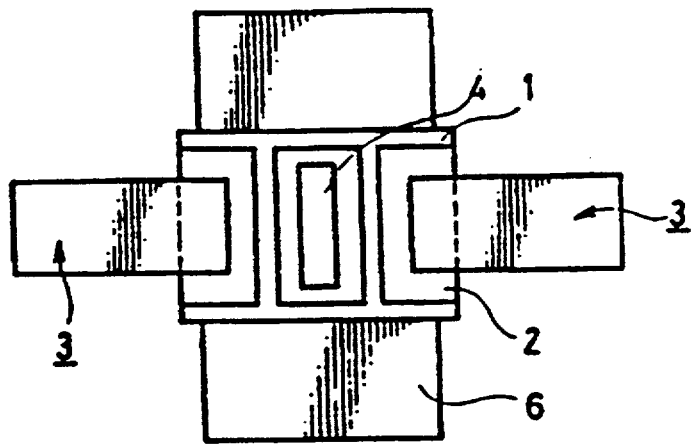
Figure 5B:
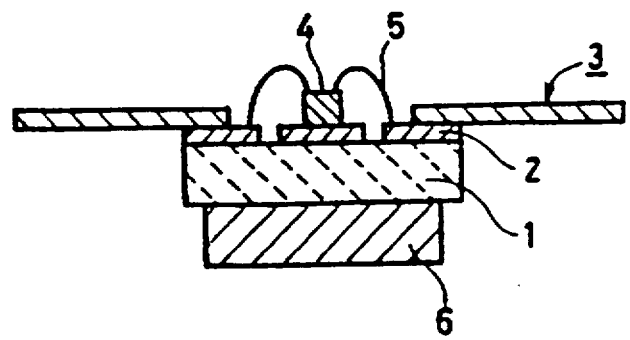
Figure 5C:
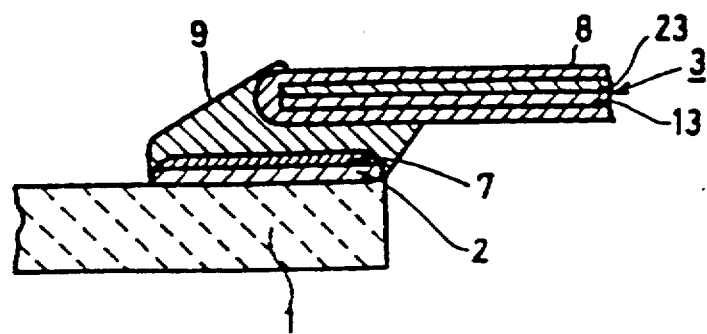
Figure 6A:
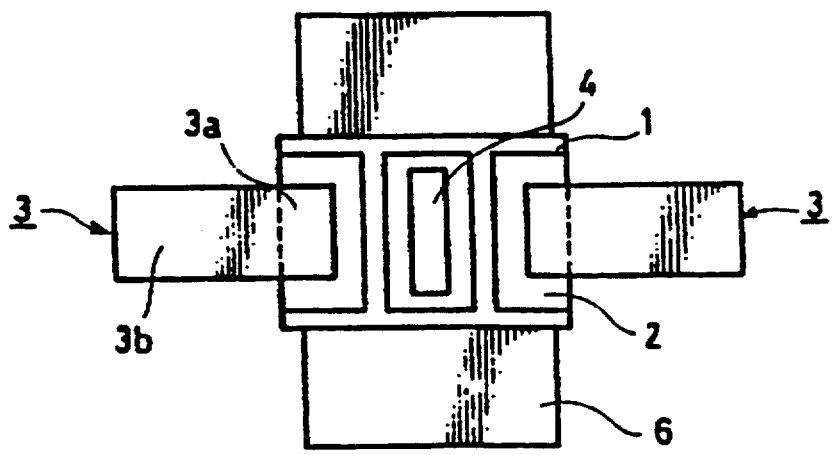
Figure 6B:
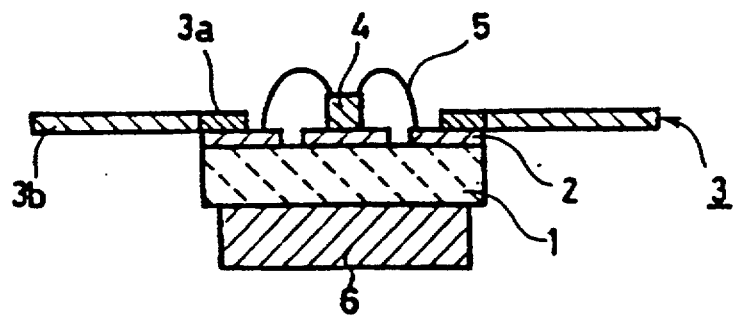
Figure 6C:
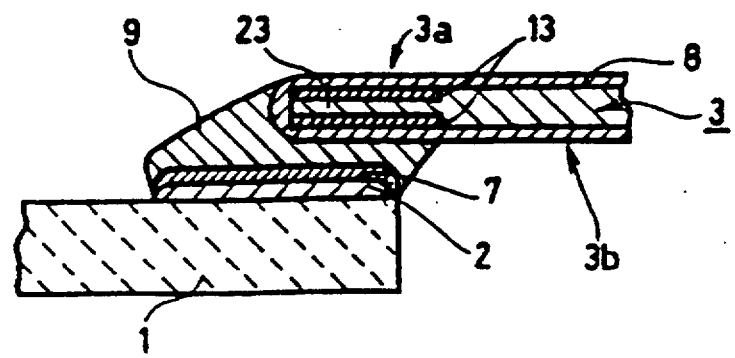
Figure 7:
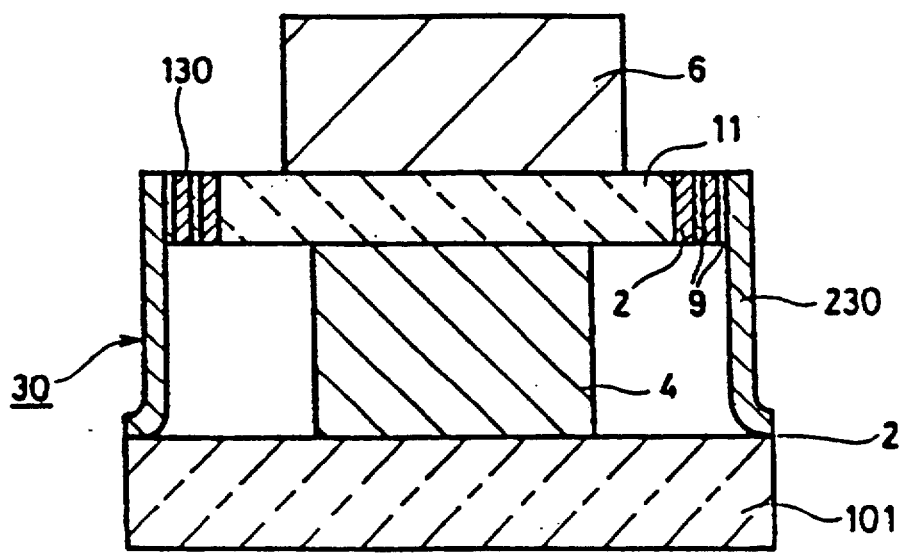
Figure 8:
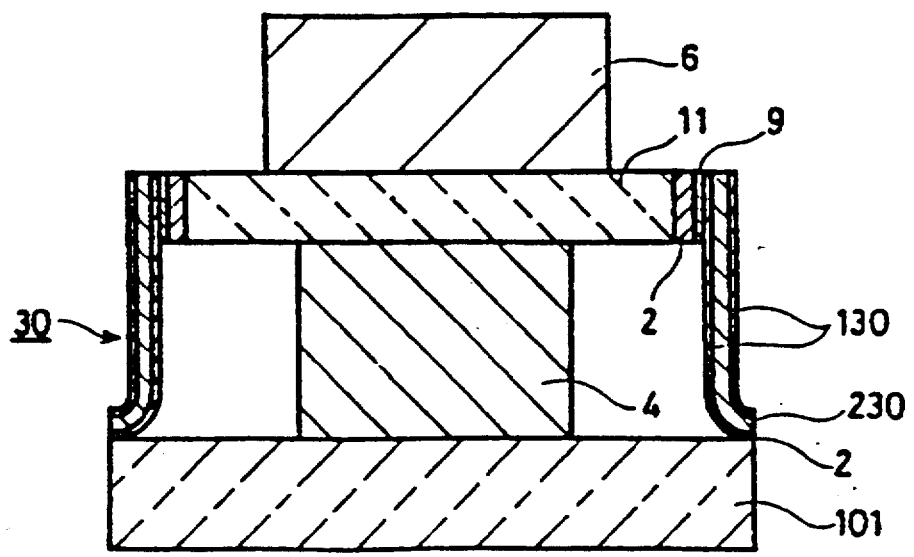
Figure 9:
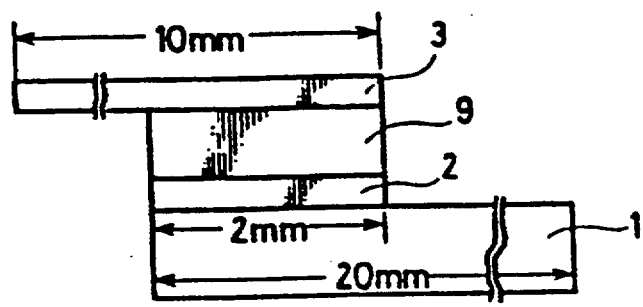
Figure 10:
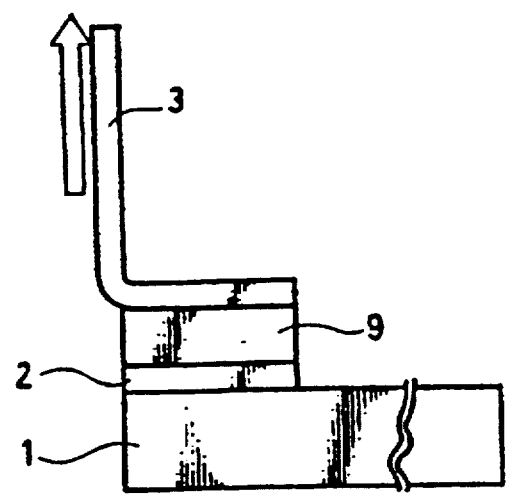
Figure 11:
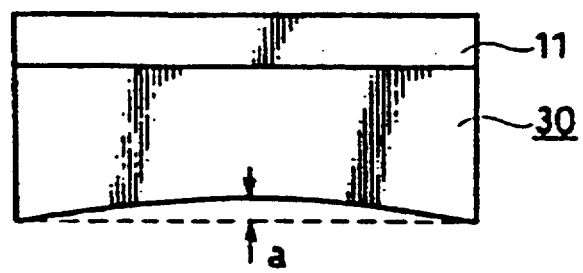
Figure 12:
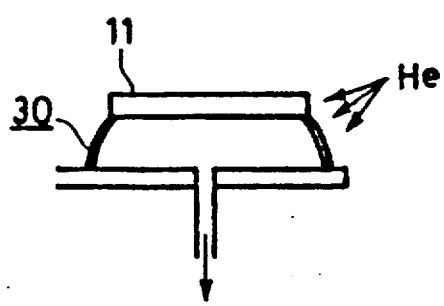

A metallized layer including molybdenum as a major component was formed in the same manner as in the Example A, on a surrounding portion of a covering member formed as a sintered body of aluminum nitride having a thickness of 3 mm and an area of 10 mm × 10 mm. After nickel plating was applied to the metallized layer, a frame member 0.1 mm thick was soldered thereon by a silver solder at a temperature of 830° C. This frame member was formed as a three-layer composite metal shown in Table 5. In the case of using copper as an outer layer portion of the frame member, a nickel plating process was applied before the soldering. Warping and airtightness of each of the caps thus obtained were measured. The warping was measured as the value a as shown in FIG. 11 in the junction between a covering member 11 and a frame member 30. Airtightness was measured by placing each cap in a helium gas atmosphere and evacuating the cap as shown in FIG. 12. The junction portion between a covering member of an aluminum nitride sintered body and a frame member was examined by a scanning type electronic microscope at a magnification of 5000 or a stereoscopic microscope at a magnification of 40 to examine cracks or defects.

Samples each having a frame member of a two-layer composite metal or a single-layer composite metal were also prepared for comparison and the warping and airtightness thereof were measured.

The results of the measurements are shown in Table 5. The values of warping indicated in Table 5 are average values each obtained from five measured values. As can be clearly seen from Table 5, the caps having the connection structures in accordance with the present invention have excellent characteristics in resistance to warping and airtightness. In addition, no cracks were found in the junction portions of the caps in accordance with the present invention.

TABLE 5

| | | Three layer Composite Metal | | | | | |
|---|---|---|---|---|---|---|---|
| | No. | Outer Layer on Soldered Surface | Central Layer | Outer Layer on Opposite Surface | Warping (μm) | Airtightness (atmcc/sec) | Observation of Structure |
| Samples of the Invention | 1 | Cu (20) | Kovar (60) | Cu (20) | 4.8 | $1 \times 10^{-11}$ | No Cracks |
| | 2 | Cu (20) | 42 Alloy (60) | Cu (20) | 5.6 | $1.5 \times 10^{-11}$ | " |
| | 3 | Fe (20) | Kovar (60) | Fe (20) | 12.1 | $1.6 \times 10^{-11}$ | " |
| | 4 | Fe (20) | 42 Alloy (60) | Fe (20) | 13.6 | $1.2 \times 10^{-11}$ | " |
| | 5 | Ni (20) | Kovar (60) | Ni (20) | 6.2 | $2.0 \times 10^{-11}$ | " |
| | 6 | Ni (20) | 42 Alloy | Ni (20) | 7.8 | $2.1 \times 10^{-11}$ | " |
| Samples for Comparison | 1 | Cu (20) | Kovar (80) | — | 52.1 | Incapable of Being Measured | " |
| | 2 | Fe (40) | 42 Alloy (60) | — | 41.6 | Incapable of Being Measured | " |
| | 3 | Kovar (100) | — | — | 100.6 | Incapable of Being Measured | Cracks |
| | 4 | 42 Alloy (100) | — | — | 12.1 | Incapable of Being Measured | " |

Values in () represent thickness of the respective layers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A connection structure between components of a semiconductor apparatus, comprising: a base member made of aluminum nitride having a major surface on which a semiconductor device is to be mounted, said aluminum nitride having a first thermal expansion coefficient, a connection member to be joined to said base member, said connection member being made of an alloy selected from the group consisting of iron-nickel alloys and iron-nickel-cobalt alloys having a second thermal expansion coefficient, a plastically deformable stress relieving member interposed between said aluminum nitride base member and said connection member, and a soldering material for joining said base member, said stress relieving member, and said connection member, said plastically deformable stress relieving member being made of a material selected from the group consisting of copper, copper alloys, nickel alloys, iron, and aluminum having a plastic deformability sufficiently high for relieving a thermal stress caused by a difference between said first and second thermal expansion coefficients of said base member and of said connection member during a cooling process at the time of soldering.

2. A connection structure in accordance with claim 1, wherein said connection member includes a lead frame.

3. A connection structure in accordance with claim 2, wherein said stress relieving member has a thickness in the range from 0.01 to 1 mm when said lead frame has a thickness of 0.1 mm and a width of 8 mm.

4. A connection structure in accordance with claim 1, wherein said base member includes a sintered body.

5. A connection structure in accordance with claim 1, wherein said connection structure further comprises a metallized layer formed on a junction surface of said base member.

6. A connection structure in accordance with claim 5, wherein said metallized layer contains at least a metal selected out of tungsten and molybdenum, at least an aluminum compound selected among the group of aluminum nitride, aluminum oxide and aluminum oxynitride, and calcium oxide.

7. A connection structure in accordance with claim 5, further comprising a plated layer formed on a surface of said metallized layer to be jointed with said soldering material.

8. A connection structure in accordance with claim 7, further comprising a plated layer formed on a surface of said connection member to be joined with said soldering material.

9. A cap for airtightly enclosing and protecting a semiconductor device mounted on an insulating base plate, comprising: a covering member made of aluminum nitride, a frame member to be joined to said covering member to surround said semiconductor device located under said covering member, said frame member being made of an alloy selected from the group consisting of iron-nickel alloys and iron-nickel-cobalt alloys, a plastically deformable stress relieving member interposed between said covering member and said frame member, and a soldering member for joining said covering member, said stress relieving member and said frame member, said plastically deformable stress relieving member being of a material selected from the group consisting of copper, copper alloys, nickel, nickel alloys, iron, and aluminum which have a plastic deformability sufficient for relieving a thermal stress caused between said covering member and said frame member by a difference between a thermal expansion coefficient of said covering member and a thermal expansion coefficient of said frame member during a cooling process at the time of soldering.

* * * * *

UNITED STATES PATENT AND TRADEMARK OFFICE
CERTIFICATE OF CORRECTION

PATENT NO. : 5,010,388　　　　　　　　　　　　　　Page 1 of 23

DATED : April 23, 1991

INVENTOR(S) : Sasame et al

It is certified that error appears in the above-indentified patent and that said Letters Patent is hereby corrected as shown below:

Columns 1-20 should be deleted and replaced with Column 1-22 as attached.

Signed and Sealed this

Eighth Day of November, 1994

Attest:

BRUCE LEHMAN

Attesting Officer　　　　　Commissioner of Patents and Trademarks

United States Patent [19]

Sasame et al.

[11] Patent Number: 5,010,388
[45] Date of Patent: Apr. 23, 1991

[54] CONNECTION STRUCTURE BETWEEN COMPONENTS FOR SEMICONDUCTOR APPARATUS

[75] Inventors: Akira Sasame; Hitoyuki Sakanoue; Hisao Takeuchi; Masaya Miyake; Akira Yamakawa; Yasuhisa Yushio; Hitoshi Akazawa, all of Hyogo, Japan

[73] Assignee: Sumitomo Electric Industries, Ltd., Osaka, Japan

[21] Appl. No.: 212,944

[22] Filed: Jun. 28, 1988

[30] Foreign Application Priority Data

| Jul. 3, 1987 | [JP] | Japan | 62-165190 |
| Jul. 14, 1987 | [JP] | Japan | 62-175070 |
| Oct. 30, 1987 | [JP] | Japan | 62-275277 |
| Dec. 15, 1987 | [JP] | Japan | 62-315330 |

[51] Int. Cl.⁵ .............. H01L 23/48; H01L 23/02; H01L 39/02; H01L 29/44
[52] U.S. Cl. ..................... 357/70; 357/67; 357/74; 357/80; 357/71
[58] Field of Search ............ 357/70, 74, 82, 80, 357/67, 71, 67; 174/16, 52; 428/621, 622

[56] References Cited

U.S. PATENT DOCUMENTS

| 4,704,320 | 11/1987 | Mizunya et al. | 428/210 |
| 4,729,010 | 3/1988 | Tsuchiya et al. | 357/70 |
| 4,761,345 | 8/1988 | Sato et al. | 428/552 |
| 4,761,518 | 8/1988 | Butt et al. | 174/52 |
| 4,764,435 | 8/1988 | Hasizaki et al. | 428/621 |
| 4,835,065 | 5/1989 | Sato et al. | 428/622 |
| 4,873,151 | 10/1989 | Sato et al. | 428/627 |

OTHER PUBLICATIONS

MIL-STD-883B of Aug. 31, 1977; Method 2004.3.

Primary Examiner—Jerome Jackson, Jr.
Assistant Examiner—D. Monin
Attorney, Agent, or Firm—W. G. Fasse; D. H. Kane, Jr.

[57] ABSTRACT

A connection structure between lead frames and a base plate of aluminum nitride, to be applied as a connection structure between components of a semiconductor apparatus, has a base plate made of a sintered body of aluminum nitride on which a semiconductor device is to be mounted. The lead frames are made of iron alloy containing nickel in 29 wt. % and cobalt in 17 wt. %. A silver solder is used for joining the base plate and the lead frames. A surface of the lead frame to be joined to the base plate is clad with a stress relief layer of oxygen-free copper of a high plastic deformability to relieve, by its plastic deformation, a thermal stress caused by a difference between a thermal expansion coefficient of the aluminum nitride base plate and that of the lead frame in a cooling process at the time of soldering. Preferably, only a portion of each lead frame to be joined to the base plate comprises an inner layer of an iron alloy containing 29 wt. % of nickel and 17 wt. % of cobalt, and an outer layer portion of oxygen-free copper.

9 Claims, 11 Drawing Sheets

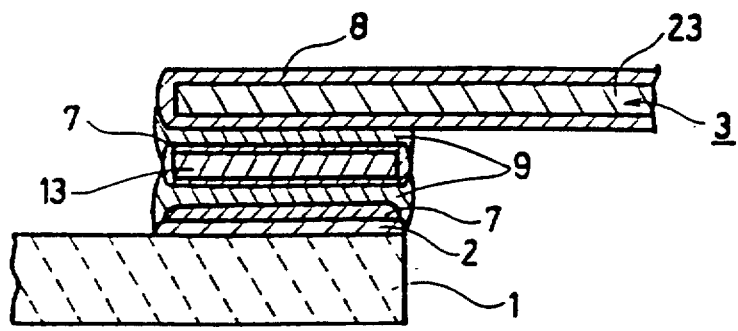

BEST AVAILABLE COPY

CONNECTION STRUCTURE BETWEEN COMPONENTS FOR SEMICONDUCTOR APPARATUS

FIELD OF THE INVENTION

The present invention relates to a connection structure between components for a semiconductor apparatus and particularly to a connection structure where a high thermal conductivity is required for mounting of a semiconductor device involving considerable heat generation, such as in a high-power transistor or in a laser diode.

BACKGROUND INFORMATION

A connection structure between components of a semiconductor apparatus generally comprises an insulating base member and connection members joined thereto. For example, the connection structure comprises an insulating base plate on which a semiconductor device is mounted, and lead frames connected by soldering using silver solder in predetermined portions where connection circuits or the like are formed on the insulating base plate. In such a case, the insulating base plate generally needs to have a good electrical insulation, a high mechanical strength and a high thermal conductivity for dissipation of heat from the semiconductor device, so as to maintain the insulation from the semiconductor device. The lead frames need to have a low electric resistance and a high mechanical strength. For example, actual characteristics required for the lead frames are indicated in MIL STD 883B. This standard specifies such characteristics as the tensile strength, the bending strength and fatigue required for the lead frames. Alumina ($Al_2O_3$) which satisfies the above mentioned requirements is generally selected in the prior art as a material of an insulating base plate used for the connection structure between components of a semiconductor apparatus. For the lead frames, iron-nickel alloys such as Kovar (trade name, i.e., an alloy of Fe-29 wt. % Ni-17 wt. % Co) and 42 alloy (i.e., an alloy of Fe-42 wt. % Ni) are generally selected as the materials satisfying the requirements of the above mentioned standard. A technical paper entitled "Ceramic Substrate and IC Package" pp. 59–67 in the special issue of "Electroceramics" of "Kagakukogyo" of March 1984 discloses a connection structure in which lead frames of Kovar (trade name) are fixed by silver solder to metallized layers formed as connection circuits on an insulating base plate of alumina, the connection structure being used as a base on which a semiconductor apparatus is mounted.

Figure 1B:
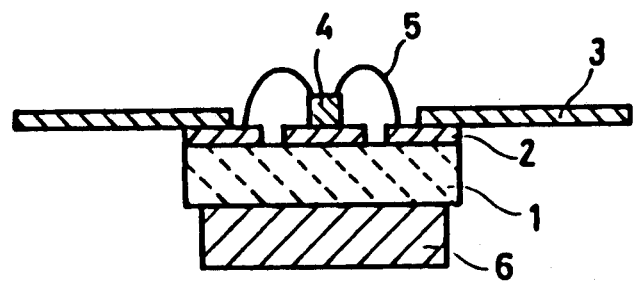
Figure 1C:
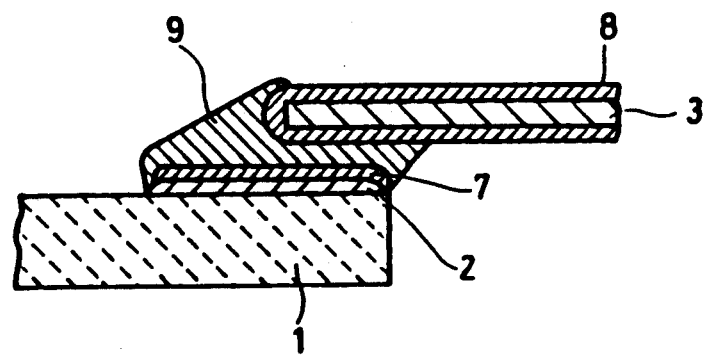

FIG. 1A is a plan view showing an example of a conventional connection structure between components of a semiconductor apparatus as described above; Fig. 1B is a sectional view thereof; and FIG. 1C is a sectional view showing details of a junction portion between a lead frame 3 and a base plate 1 of alumina. Referring to those figures, in this connection structure, a metallized layer 2 is formed on specified regions of a major surface of the base plate 1 and lead frames 3 are joined to the metallized layer 2 by a metal solder or the like. A semiconductor device 4 such as a field effect transistor involving considerable heat generation, is mounted in a predetermined position on the base plate 1 and it is connected with the metallized layer 2 or the lead frames 3 by bonding wires 5. Further, a heat sink 6 of a tungsten alloy, e.g., a copper-tungsten alloy is fixed on another surface of the base plate 1, opposite to the above mentioned major surface on which the semiconductor device 4 is mounted. In addition, as shown in FIG. 1C, a thin plated layer 7 is formed on a metallized layer 2 in the junction portion between the base plate 1 and the lead frame 3, and a plated layer 8 is formed, as required, on the surfaces of the lead frame 3 to ensure a stable wettability for a metal solder 9.

Although alumina has an excellent electric insulation and mechanical strength, its heat dissipation is not good because its thermal conductivity is as low as 17 $Wm^{-1}K^{-1}$. Accordingly, alumina is not suited for a base material, for example, on which a field effect transistor involving considerable heat generation is to be mounted. It is also known that an insulating base plate using beryllia (BeO) having a thermal conductivity as high as 260 $Wm^{-1}K^{-1}$ is used for mounting a semiconductor device involving considerable heat generation. However, beryllia is toxic and safety measures to be taken are complicated.

Further, Japanese Patent Laying-Open No. 21032/1984 discloses a base plate formed of a material containing 2 to 30 wt. % of copper in tungsten or molybdenum as a base plate having a high thermal conductivity for mounting a semiconductor device. However, this base plate does not have the required electric insulation and alumina not having a good heat dissipation, is used as a material surrounding the device.

Under the circumstances, special interest has been drawn recently to aluminum nitride (AlN) as an insulating base metal for mounting a semiconductor device involving considerable heat generation, since aluminum nitride has substantially as good a thermal conductivity as that of beryllia, i.e., 200 $Wm^{-1}K^{-1}$ and it has no toxicity and has as good an electric insulation and a mechanical strength as those of alumina.

However, if lead frames are soldered to an aluminum nitride base plate by a metal solder, e.g., a silver solder (Ag-Cu), an average thermal expansion coefficient of aluminum nitride in a range from a room temperature to a silver soldering temperature (780° C.), is as small as $4.3 \times 10^{-6}$ $K^{-1}$, while an average thermal expansion coefficient of iron-nickel alloy of the lead frames is very high, e.g., $10 \times 10^{-6}$ $K^{-1}$ in the case of Kovar and $11 \times 10^{-6} K^{-1}$ in the case of 42-alloy. Consequently, the difference between the thermal expansion coefficient of the aluminum nitride base plate and that of the lead frames causes a strain due to a large thermal stress as a residual stress in the aluminum nitride base plate in a cooling process for silver soldering of the lead frames to the aluminum nitride base plate. Accordingly, if the lead frames are drawn in a direction of detachment from the base plate, the connection structure is easily broken and a sufficient strength of the juntion of the lead frames can not be assured.

In addition, it has been proposed to use lead frames of molybdenum having substantially an equal thermal expansion coefficient as that of aluminum nitride so as to relieve a strain due to a thermal stress. However, since molybdenum is expensive and does not have a good formability, it does not serve well for providing a connection structure easy to use and having a low cost, to be applied between components for a semiconductor apparatus.

On the other hand, Japanese Patent Laying-Open No. 167833/1987 discloses that the thermal expansion coefficient of the lead frames is suitably changed by adjusting the composition of an iron-nickel-cobalt alloy used as the material of the lead frames, thereby to remove or reduce residual stress and strain caused by soldering of the lead frames to a sintered body of ceramics having a low thermal expansion coefficient, such as aluminum nitride. However, according to this technique, it is necessary to finely adjust the composition of the iron-nickel-cobalt alloy as conventionally used as the material of the lead frames and consequently the manufacturing process is complicated.

Figure 2A:
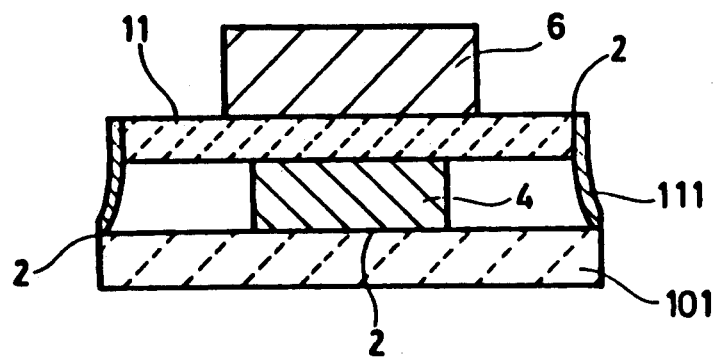
FIGS. 2A and 2B are sectional views showing a conventional connection structure between components for a semiconductor apparatus such as a connection structure to be used as a cap for airtightly enclosing a semiconductor device mounted on an insulating base plate.
Figure 2B:
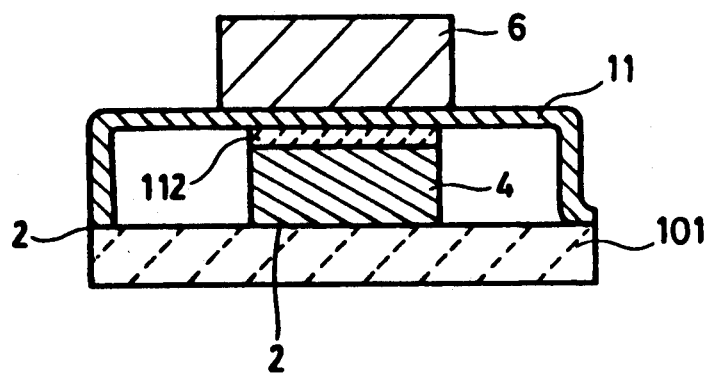

Another example of a connection structure between components for a semiconductor apparatus is a cap for airtightly enclosing a semiconductor device mounted on an insulating base plate. The material of the cap for enclosing of the semiconductor device, for which a high reliability is required, is for example a low thermal expansion alloy material such as 42-alloy or Kovar (trade name), or a ceramic such as alumina or mullite. The structure of the cap is as shown in FIGS. 2A and 2B. The semiconductor device 4 is mounted on a ceramic base plate 101 and is covered with a covering member 11. If the covering member 11 is made of insulating ceramics, that is, in the case shown in FIG. 2A, a skirt-shaped metal frame 111 surrounds the covering member 11. If the covering member 11 is made of an alloy material having conductivity, that is, in the case of FIG. 2B, an insulator layer 112 is provided in a contact portion between the covering member 11 and the semiconductor device 4. Thus, the cap provided with the insulator as described above, has a structure preventing a leak current from the semiconductor device 4. In both of FIGS. 2A and 2B, metallized layers 2 are formed in junction portions and a heat sink 6 for enhancing heat dissipation is provided on the covering member 11.

Since semiconductor devices have a tendency to generate a considerable amount of heat, it is of urgent necessity to develop caps having an excellent heat dissipation. For example, if a cap of a metal material having a high thermal conductivity is used, it is necessary to provide insulator portions as described above, which increases the manufacturing costs and reduces the thermal conductivity.

Therefore, caps using materials having a high thermal conductivity and an excellent insulation have become of substantial interest. Beryllia (BeO), silicon carbide (SiC) and aluminum nitride (AlN) may be considered as materials satisfying such requirements. However, beryllia and silicon carbide are disadvantageous in view of their toxicity and their electric characteristics and because their supply can be irregular. Accordingly, aluminum nitride is most suitable. However, in order to manufacture caps using aluminum nitride as the covering material, it is necessary to apply a metallization to portions to be joined to the frame member on the surface of the covering material of aluminum nitride and then to solder the covering member to the frame member by metal solder.

In such a case, if metal soldering, e.g., silver soldering (Ag-Cu) is applied, there is a considerable difference between the average thermal expansion coefficient of aluminum nitride and that of iron-nickel alloy, as described previously. More specifically, the average thermal expansion coefficient of aluminum nitride is low, i.e., $4.3 \times 10^{-6} K^{-1}$ in the range from the room temperature to the temperature for silver soldering (780° C.), while the average thermal expansion coefficient of iron-nickel alloy of low thermal expansion used generally for the frame member is extremely high, i.e., $10 \times 10^{-6}$ $K^{-1}$ (in the case of Kovar) to $11 \times 10^{-6} K^{-1}$ (in the case of 42-alloy). As a result, a residual strain occurs due to strong thermal stress caused in the covering member of aluminum nitride. The residual strain causes cracks in the covering member of aluminum nitride and warping or deformation of the frame member. Thus, the above described prior art does not make it possible to provide a cap with a high dimensional precision, good air-tightness and high reliability.

SUMMARY OF THE INVENTION

It is an object of the present invention to provide a connection structure between components of a semiconductor apparatus, which uses a base member of aluminum nitride having good head dissipation suitable for mounting of a semiconductor device involving considerable heat generation and makes it possible to join a connection member to the base member with an appropriate junction strength.

According to the present invention it has been found that the residual strain due to thermal stress caused by the cooling process after soldering can be relieved effectively if a specified thermal stress relieving member is interposed between a base member of aluminum nitride and a connection member including as a main material any of iron-nickel alloys and iron-nickel-cobalt alloys.

According to an aspect of the present invention, a connection structure between components of a semiconductor apparatus comprises: a base member of aluminum nitride having a major surface on which a semiconductor device is to be mounted; a connection member including, as a main material, any of iron-nickel alloys and iron-nickel-cobalt alloys; a stress relieving member; and a solder member for joining the base member, the stress relieving member and the connection member. The stress relieving member is interposed between the base member and the connection member and it is made of any soft metal or soft alloys having a high plastic deformability to relieve the thermal stress caused by the difference between the thermal expansion coefficient of the base member and that of the connection member by plastic deformation of the stress relieving member itself.

Preferably, the stress relieving member may be formed of any material selected from the group of copper, copper alloys, nickel, nickel alloys, iron or aluminum. The connection member may be lead frames 0.1 mm thick and 8 mm wide for example, which values allow the stress relieving member to have a thickness of 0.01 to 1 mm. The base member of aluminum nitride is preferably a sintered body. Further, the connection structure between components for a semiconductor apparatus preferably comprises a metallized layer formed on a junction surface of the base member. Preferably, the metallized layer contains at least a metal selected from tungsten and molybdenum, at least an aluminum compound selected from the group of aluminum nitride, aluminum oxide and aluminum oxynitride, and calcium oxide. A plated layer is preferably formed on a junction surface of the metallized layer to be connected with a solder material. A plated layer is also preferably formed on a surface of the connection member to be joined with the solder material.

Thus, if any soft metal or soft alloy is used as the stress relieving member between the base member of aluminum nitride and the connection member, the stress relieving member becomes further softened near a temperature for soldering and it becomes readily plastically deformable. As a result, most of the thermal stress caused by the difference in the thermal expansion coefficients of the aluminum nitride base member and the connection member is absorbed by the plastic deformation of the stress relieving member, whereby residual stress in the base member of aluminum nitride disappears. Consequently, a desired strength of soldering can be attained.

If a lead frame as the connection member is 0.1 mm thick and 8 mm wide, the thickness of the stress relieving member is preferably in the range from 0.01 to 1 mm. If the stress relieving member is less than 0.01 mm thick, it is too thin to allow a sufficient amount of plastic deformation and cannot absorb the thermal stress in a satisfactory manner. If the thickness of the stress relieving member is more than 1 mm, a thermal stress caused by the thermal expansion of the stress relieving member itself at the time of soldering cannot be disregarded. More specifically, even if the thermal stress caused by the difference between the thermal expansion coefficients of the lead frames and of the aluminum nitride base member can be absorbed by the plastic deformation of the stress relieving member, the considerably large thermal stress of the stress relieving member itself adversely affects the lead frames and the base member of aluminum nitride, resulting in a thermal strain in those members.

In addition, a metallized layer is preferably formed on the junction surface of the base member of aluminum nitride and if the metallized layer contains at least a metal selected from tungsten and molybdenum, at least an aluminum compound selected from aluminum nitride, aluminum oxide and aluminum oxynitride, and calcium oxide, a desired junction strength and thermal conductivity are achieved.

If a plated layer is formed on a surface of the metallized layer to be joined with solder material, a uniform and stable soldering can be applied thereto, because the wettability of the solder material and the metallized layer can be improved by the plated layer provided therebetween. The plated layer formed on the surface of the connection member to be joined with the solder member has also the same effect. These plated layers are formed preferably by nickel plating. Particularly, if a treatment such as gold plating is to be applied as an aftertreatment, it is preferred to apply a nickel plating for the purposes of improving the adhesion and deposition of the gold plating and forming a uniform gold plated layer on the nickel plating.

According to another aspect of the present invention a connection structure between components of a semiconductor apparatus comprises: a base member of aluminum nitride; a connection member including, as a main material, any of iron-nickel alloys and iron-nickel-cobalt alloys; and a solder material for joining the base member and the connection member, whereby the below described features are achieved. At least a surface of the connection member to be joined to the base member is made of an soft metal or soft alloys having a high plastic deformativity so that the surface of the connection member itself is deformed plastically to relieve the thermal stress caused by a difference between the thermal expansion coefficients of the base member and of the connection member. In the above described connection structure between components of a semiconductor apparatus, the junction face between the connection member and the base member is preferably formed of any material selected from copper, copper alloys, nickel, nickel alloys, iron and aluminum. The connection member preferably includes lead frames. Further, at least a portion of the connection member to be joined to the base member preferably includes an inner layer portion made of any iron-nickel alloys and iron-nickel-cobalt alloys, and an outer layer portion made of any of soft metals or soft alloys. In that case, the other portions of the connection member excluding the portion joined to the base member are preferably made of any material selected from iron-nickel alloys and iron-nickel-cobalt alloys.

In the above described connection structure, any soft metal or soft alloy forming the surface of the connection member joined to the base member of aluminum nitride, is plastically deformed to relieve the thermal stress caused by the difference between the thermal expansion coefficient of the base member of aluminum nitride and that of the connection member. Accordingly, if the base member of aluminum nitride and the connection member are soldered, the connection structure can provide a sufficiently high junction strength since the thermal stress caused therebetween has been relieved. Thus, the connection structure has a high reliability and a high resistance to thermal stress.

In the case of soldering the connection member to the base member of aluminum nitride, if at least the portion of the connection member joined to the base member includes an inner layer portion made of iron-nickel alloy or iron-nickel-cobalt alloy, and an outer layer portion formed of a soft metal or a soft alloy, the outer layer portion of the soft metal or the soft alloy to be joined to the base member of aluminum nitride, is plastically deformed to relieve the thermal stress caused between the base member of aluminum nitride and the connection member. In such a case, if the entire connection member has a three-layer structure including an inner layer portion and outer layer portions, the bending strength of the connection member itself is lowered, which may cause an inconvenience in practical use. For this reason, the connection member may be formed so that only the junction portion subjected to thermal stress has a three-layer structure and the other portions have a single-layer structure of iron-nickel alloy or iron-nickel-cobalt alloy to maintain a high bending strength. Further, if a two-layer composite structure is adopted in which a single stress relieving layer of a soft metal or a soft alloy is formed on a portion of the connection member such as a lead frame to be soldered, this two-layer composite structure has also an effect of relieving thermal stress. However, in this two-layer composite structure, warping or deformation may occur in the lead frames due to a bimetal effect at the time of soldering at a high temperature and voids could be easily generated in the junction portions between the lead frames and the base member of aluminum nitride. Thus, the junction strength of the connection member, such as the lead frames, cannot be uniform and the reliability of the connection structure itself is lowered.

For example, let us assume a case in which copper is selected as the soft metal material of the surface of the connection member joined to the base member, Kovar (trade name, i.e., Fe-29 wt. % Ni-17 wt. % Co) is selected as a main material of the connection member and a composite metal plate formed by combination of those materials is soldered to the base member of aluminum nitride by silver solder. In this case, copper is plastically deformed in a temperature range from the silver soldering temperature of 780° C. or a higher temperature by about 200° C., whereby the thermal stress caused between the Kovar and the base plate of aluminum nitride can be relieved. Although the thermal expansion coefficient of copper is as high as $18 \times 10^{-6} K^{-1}$, which value is considerably larger than that of aluminum nitride, it hardly causes residual strain due to thermal stress generated in the cooling process following the soldering, because copper has a high plastic deformability enabling it to be plastically deformed in the cooling process. In addition, if oxygen free copper is used as the copper for the junction surface, it has a particularly remarkable effect of relieving the thermal stress. Kovar as one of iron-nickel-cobalt alloys is selected as the main material of the connection member not only because it is industrially suited as the material for the lead frames and the like, but also because it has a thermal expansion coefficient close to that of aluminum nitride among the metal materials. The reason for forming the connection member such as the lead frame, as a composite metal plate, is that a lead frame made only of a soft metal material itself, has low tensile and bending strengths and it would involve a disadvantage in practical application.

The soft metal materials may be not only copper or copper alloys but also nickel, iron and aluminum metals or alloys thereof. However, if aluminum is used, the desired effect can be obtained only in the case of soldering it with a low melting solder material.

According to a further aspect of the present invention, a connection structure between components of a semiconductor apparatus comprises a protection cap for airtightly enclosing a semiconductor device mounted on an insulating base plate. The cap comprises a covering member made of aluminum nitride, a frame member made of any of iron-nickel alloys and iron-nickel-cobalt alloys, to be joined to the covering member to surround the semiconductor device located under the covering member, a stress relieving member, and a soldering material for joining the covering member. the stress relieving member and the frame member to one another. The stress relieving member is interposted between the covering member and the frame member and it is made of a soft metal or a soft alloy having a high plastic deformativity to relieve, by plastic deformation of itself, a thermal stress caused by a difference between the thermal expansion coefficient of the covering member and that of the frame member. The stress relieving member is preferably made of any of copper, copper alloys, nickel, nickel alloys, iron and aluminum.

The cap in accordance with the present invention comprises the covering member, the frame member and the soldering material and it has the below described features. A least a junction surface between the frame member and the covering member is made of a soft metal or a soft alloy having a high plastic deformability so that it is plastically deformed itself to relieve the thermal stress caused by the difference between the thermal expansion coefficient of the covering member and that of the frame member in a cooling process at the time of soldering. In this case, the junction surface is preferably made of copper, copper alloys, nickel, nickel alloys, iron or aluminum. At least a portion of the frame member to be joined to the covering member comprises an inner layer portion made of iron-nickel alloys or iron-nickel-cobalt alloys, and an outer layer portion made of any soft metal or soft alloys.

In the cap in accordance with the present invention, the stress relieving member interposted between the covering member and the frame member, or the soft metal material of the portion of the frame member to be joined to the covering member, is plastically deformed, so as to relieve a thermal stress caused by the difference between the thermal expansion coefficient of the covering member and that of the frame member in the cooling process at the time of soldering. Further, since the portion of the frame member to be joined to the covering member comprises an inner layer portion of iron-nickel alloy and an outer layer portion of a soft metal material, it becomes possible to suppress the generation of cracks in the covering member of aluminum nitride and to suppress the bimetal effect, whereby warping and deformation of the frame member can be reduced. Thus, the present invention makes it possible to provide a cap with a high dimensional precision or stability and a high reliability, ensuring good airtightness. Since the surface layer portion of the junction surface to be soldered is at least formed of a soft metal material, the soft metal material relieves the thermal stress applied to the junction surface and accordingly the junction strength between the respective members of the cap is sufficiently high, which also enhances the reliability.

For example, let us assume a case in which copper is selected as the soft metal material, Kovar (trade name) is selected as the main material of the frame member, and a three-layer composite metal plate formed by combination thereof, is soldered by a silver solder to the covering member of aluminum nitride. In this case, the copper is plastically deformed in a temperature range from the silver soldering temperature, i.e., 780° C. or a higher temperature by about 200° C., so as to relieve the thermal stress applied between the Kovar and the aluminum nitride. In this example, the materials of the respective members have the same function as described above with reference to the example of the connection structure between the lead frames and the base plate of aluminum nitride.

These objects and other objects. features. aspects and advantages of the present invention will become more apparent from the following detailed description of the present invention when taken in conjunction with the accompanying drawings.

BRIEF DESCRIPTION OF THE DRAWINGS

Figure 10:
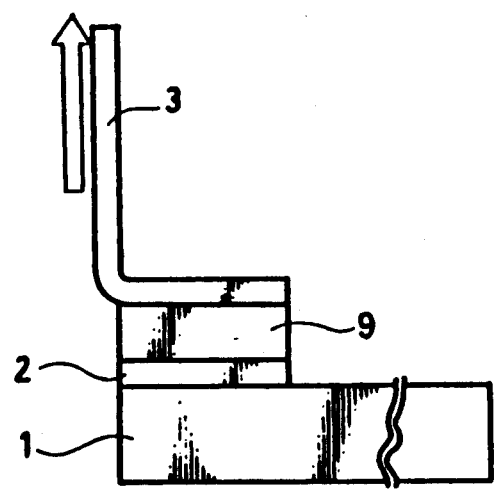
FIG. 10 is a side view for explaining a test method for measuring the junction strength of a lead frame joined to a base plate of aluminum nitride.

FIGS. 1A, 1B, and 1C are plan and sectional views showing a conventional structure between components for semiconductor apparatus, such as a connection structure between a alumina base plate and lead frames;

FIGS. 2A and 2B are sectional views showing a conventional connection structure between components for a semiconductor apparatus such as a connection structure to be used as a cap for airtightly enclosing a semiconductor device mounted on an insulating base plate;

FIGS. 3A and 3B are process charts schematically showing two methods for fabricating a connection structure between components for a semiconductor apparatus in accordance with the present invention;

FIGS. 4A, 4B, and 4C are plan and sectional views showing a connection structure between components for a semiconductor apparatus in accordance with an embodiment of the present invention, e.g., a connection structure among lead frames, a stress relieving member and a base plate of aluminum nitride;

FIGS. 5A, 5B, and 5C are plan and sectional views showing a connection structure between components for a semiconductor apparatus in accordance with another embodiment of the present invention, e.g., a connection structure between lead frames of a composite metal plate and a base plate of aluminum nitride;

FIGS. 6A, 6B, 6CI, and 6CII are plan and sectional views showing a connection structure between components for a semiconductor apparatus in accordance with a further embodiment of the present invention, e.g., a connection structure between lead frames of a three-layer composite structure and a base plate of aluminum nitride;

FIG. 7 is a sectional view showing a further embodiment of the invention in which a connection structure between components for a semiconductor apparatus, is applied to a cap;

FIG. 8 is a sectional view showing a still further embodiment of the invention in which a connection structure between components for a semiconductor apparatus, is applied to a cap;

FIG. 9 is a side view showing a dimensional relation in an example of a connection structure between a lead frame and a base plate of aluminum nitride;

FIG. 10 is a side view for explaining a test method for measuring the junction strength of a lead frame joined to a base plate of aluminum nitride;

FIG. 11 shows the measuring of a warping in a frame member such as a cap; and

FIG. 12 is an illustration for explaining a test method for measuring the airtightness of the cap of FIG. 11.

DESCRIPTION OF THE PREFERRED EMBODIMENTS

As described in the foregoing, the present invention relates to an improvement of a technique for forming a connection structure between components of a semiconductor apparatus, using a base member of aluminum nitride in the form of a sintered body obtained for example by the below described method.

The base member formed as a sintered body of aluminum nitride used in the present invention, includes preferably aluminum nitride as a major component and contains 0.01 to 1.0 wt. % of a element of the group IIIa in the periodic table and 0.001 to 0.5 wt. % of oxygen, and has a thermal conductivity higher than 180 $Wm^{-1}K^{-1}$. In forming the base member, first at least a compound containing a rare earth element is mixed with powder of aluminum nitride so that the compound containing the rare earth element, is present within the range of 0.01 to 1.0 wt. % evaluated by conversion of the rare earth element. Paraffin, PVB, PEG or the like is used as a shaping additive agent. Phenol resin or the like causing a residual carbon by decomposition, or carbon powder, graphite powder or the like may be added thereto so as to control the residual carbon in the sintered body. The rare earth compound is for example stearic acid, palmitic acid, alcoxide nitrate, carbonate or hydroxide. Preferably, a high polymer compound such as stearic acid is used. It is believed that such materials make it possible to decrease the content of the rare earth and to prepare mixture with aluminum nitride powder in good condition. Particularly, stearic acid is the most preferred in view of not only the function as the shaping additive but also the property of being mixed with aluminum nitride powder, the quantity of residual carbon, and the like. The aluminum nitride powder must be in the form of fine and uniform grains. The average grain diameter of the aluminum nitride powder is preferably 1 μm or less and the content of oxygen in the powder is preferably 2.0 wt. % or less. Such aluminum nitride powder cannot be easily obtained by a direct nitriding method (i.e., a method using nitrization of metal aluminum). It can be obtained by a reducing nitriding method (i.e., a method utilizing a reducing nitrization of aluminum oxide). If the direct nitriding method is adopted, it is necessary to pay particular attention to the control of the reaction, classification of the grain diameter and the like.

After the powder mixture has been shaped a desired form, it is sintered in a non-oxidizing atmosphere containing nitrogen. In order to make the sintered body have a high thermal conductivity, sintering is performed preferably at a temperature from 1000° to 2100° C. for more than five hours to cause an average grain diameter to be more than 5 μm. Cooling after the sintering is preferably performed rapidly. If the cooling is performed gradually, sintering additives are deposited and the sintered surfaces are considerably deteriorated. For this reason, the cooling is effected preferably down to 150° C. at a rate of 200° C./ hour.

A process for forming a metallized layer on a surface of the base member of the sintered body of aluminum nitride thus obtained is applied in the following manner.

First, the base plate of the sintered body of aluminum nitride is prepared by the above described method. As the material of the metallized layer, metal paste is prepared by mixing calcium compound powder, aluminum compound powder and metal powder of tungsten or molybdenum, and adding an organic binder such as "vehicle" thereto. Compositions of the metal paste are metal powder of 40 to 98 wt. %, aluminum compound of 1 to 25 wt. % and calcium oxide of 1 to 35 wt. %. In order to apply a sintering process as aftertreatment at a low temperature, copper or nickel may be added as catalyzer for lowering the sintering temperature. The metal paste thus prepared is coated on a major surface of the base plate formed of the sintered body of aluminum nitride. The base plate of the sintered body of aluminum nitride is fired in an inactive atmosphere of nitrogen or the like at a temperature from 1500° to 1800° C., whereby a metallized layer is formed on the surface of the base plate. If the metallized layer is formed to contain aluminum oxide of 1 to 10 wt. % as the aluminum compound and calcium oxide of 1 to 20 wt. % using tungsten powder as the metal powder, or if the metallized layer is formed to contain aluminum oxide of 1 to 10 wt. % as the aluminum compound and calcium oxide of 1 to 35 wt. % by using molybdenum powder as the metal powder, it is made possible to provide a connection structure with a desired adhesion strength between the base plate of the aluminum nitride sintered body and the metallized layer and having a good thermal conductivity.

The steps of forming a metallized layer on the surface of a base plate in the form of an aluminum nitride sintered body may be performed as follows, by sintering an aluminum nitride formed body coated with the metal paste at one time.

First, a base plate of the aluminum nitride formed body is prepared by shaping the aforementioned mixed powder into a prescribed configuration such as a green sheet. A material for the metallized layer is prepared by kneading powder of tungsten and at least one additive selected from a group of aluminum oxide, aluminum nitride, calcium oxide, yttrium oxide and stearic acid yttrium and the like, to provide a metal paste, similarly to the above. The metal paste thus provided is applied to the surface of the base plate formed by the aluminum nitride formed body, by printing or coating. The base plate formed by the aluminum nitride formed body is sintered with the metal paste similarly to the above conditions, to obtain a metallized layer on the surface of a base plate in the form of the aluminum nitride sintered body. Thus, the aluminum nitride sintered body with the metallized layer having high thermal conductivity is obtained.

A typical example of a method for forming a connection structure between components of a semiconductor apparatus in accordance with the present invention will now be described. FIGS. 3A and 3B are process charts showing two methods for forming a connection structure between components of a semiconductor apparatus in accordance with the present invention. Referring to FIG. 3A, first, an aluminum nitride sintered base plate is prepared. Then, metal paste obtained by the above described method is coated on a surface of the aluminum nitride sintered base plate. A screen printing process may be applied to the coated metal paste in accordance with a predetermined pattern, e.g., a predetermined circuit pattern. After that, the screen printed metal paste is dried. The aluminum nitride sintered base plate is fired in an inactive gas atmosphere heated at a predetermined temperature.

The above steps may be performed as follows. Referring to FIG. 3B, an aluminum nitride formed base plate is first prepared. Then, the metal paste obtained through the aforementioned method is applied to the surface of the aluminum nitride formed base plate. Thereafter the metal paste thus applied is dried. Then the aluminum nitride formed base plate is sintered with the metal paste in an inert gas atmosphere which is heated to a prescribed temperature. Thus, an aluminum nitride sintered base plate with a metallized layer is formed.

After the firing/sintering, nickel plating is applied to a surface of a metallized layer formed on the aluminum nitride sintered base plate. A heat treatment is performed at a temperature of about 800° C. to improve the strength and airtightness of the nickel plating, so that the nickel plating is sintered. Then, soldering is applied to the surface of the nickel plating to join the aluminum nitride sintered base plate, the lead frames, the frame member for a cap and the like. Further, gold plating is applied to the junction portions. Thus, the connection structure in accordance with the present invention has been formed.

An embodiment of a thus formed connection structure between components of a semiconductor apparatus in accordance with an aspect of the present invention, for example, a junction structure of lead frames, stress relieving members and a base plate of aluminum nitride will be described with reference to the drawings. FIG. 4A is a plan view showing the embodiment of the invention used for the base plate for mounting the semiconductor apparatus; FIG. 4B is a sectional view thereof; and FIG. 4C is a detailed sectional view of a junction portion of the lead frame 3 and the base plate 1' of aluminum nitride.

Referring to the figures, this connection structure includes a metallized layer 2 formed by the above described process on specified regions of a major surface of the aluminum nitride sintered base plate 1', and lead frames 3 soldered to the metallized layer 2 by metal solder or the like. A stress relieving member 13 of a soft metal such as copper coated with a nickel plated layer is interposed between the metallized layer 2 and each lead frame 3. A semiconductor device 4 such as an FET involving a considerable heat generation, is mounted on a predetermined position of the aluminum nitride base plate 1'. The semiconductor device 4 is connected with the metallized layer 2 or the lead frames 3 by bonding wires 5. Further, a heat sink 6 of a tungsten alloy, e.g., a copper-tungsten alloy is attached to another surface of the aluminum nitride base plate 1', opposite to the aforementioned major surface. In addition, as shown in FIG. 4C, the junction portion between the aluminum nitride base plate 1' and each lead frame 3 further comprises a thin plated layer 7 formed on the metallized layer 2, and a plated layer 8 formed, as required, on outer surfaces of a metal layer 23 of Kovar or the like, to ensure wettability by the metal solder 9.

Another embodiment of a connection structure between components of a semiconductor apparatus in accordance with another aspect of the invention, e.g., a connection structure between lead frames having a stress relieving layer of a soft metal material and a metal layer of iron-nickel alloy and an aluminum nitride base plate will be described with reference t the drawings. As shown in FIGS. 5A and 5B, a metallized layer 2 is formed on specified regions of a surface of the aluminum nitride base plate 1' and lead frames 3 of a composite metal layer are joined to the metallized layer 2 by soldering with a metal solder or the like. Each of the lead frames has a stress relieving layer 13 of copper or the like and a metal layer 23 of Kovar or the like. A semiconductor device 4 such as an FET involving a considerable heat generation, is mounted in a predetermined position of the aluminum nitride base plate 1' and it is connected with the metallized layer 2 or the lead frames 3 of a composite metal plate by means of bonding wires 5. Further, a heat sink 6 is attached to another surface of the aluminum nitride base plate 1'.

The metallized layer 2 may be the one conventionally used for soldering lead frames to an insulating base plate. For example, it may be formed by the above described steps of coating metal paste including tungsten or molybdenum as a major component on the aluminum nitride base plate and firing it together with the base plate, or it may be formed by a postmetallizing process, or it may be a thin film of titanium, chromium or nickel formed by vacuum evaporation or sputtering. The metal soldering material is preferably silver solder; however, it may be other solder material insofar as it can ensure a good junction between a metal material of a composite metal plate and a metallized layer by forming thin metal coated layers having good wettability with the solder material thereon. Even in the case of using silver solder, it is preferred, for example as shown in FIG. 5C, to form, as required, a thin nickel plated layer 7 on the metallized layer 2 if the metallized layer 2 includes tungsten as a major component and to form, as required, a nickel plated layer 8 on the surfaces of each lead frame 3 of a composite metal plate in advance thereby to ensure a stable wettability by the metal solder 9.

Another embodiment of a connection structure between components of a semiconductor apparatus in accordance with a further aspect of the present invention, e.g., a connection structure of lead frames having a three-layer composite structure and an aluminum nitride base plate will be described with reference to the drawings. As shown in FIGS. 6A to 6CII, in this connection structure, a metallized layer 2 is formed on specified regions of a major surface of the aluminum nitride base plate 1' and lead frames 3 each including a three-layer composite metal portion 3a and a single-layer metal portion 3b, or only a three-layer composite portion 3a, are joined to the metallized layer 2. Only the three-layer composite metal portions 3a of the lead frames 3 are joined to the metallized layer 2 by soldering with a metal solder 9. A semiconductor device 4 such as an FET involving a considerable heat generation, is mounted in a predetermined position on the aluminum nitride base plate 1' and it is connected with the metallized layer 2 or the lead frames 3 by bonding wires 5. Further, a heat sink 6 may be attached to another major surface of the aluminum nitride base plate 1' as required.

In addition, if each lead frame 3 includes a three-layer composite metal portion 3a and a single-layer metal portion 3b, a metal layer 23 of Kovar or the like out of the three layers, is formed of the same low expansion metal material as that of the single-layer metal portion 3b and stress relieving layers 13 on both sides of the metal layer 23 are formed of the same soft metal material, as shown in an enlarged view of FIG. 6CI. The three-layer composite metal portion 3a of the lead frame 3 can be formed in a manner in which the stress relieving layers 13 on both sides of the metal layer 23 to be soldered, are formed as clad materials by a cladding method. As shown in FIG. 6CI, both surfaces of the portion to be soldered in the lead frame 3, may be made thin and the stress relieving layers 13 may be formed on those surfaces to cause the three-layer composite metal portion 3a to have almost the same thickness a that of the single-layer metal portion 3b.

FIG. 6CII shows, in an enlarged view, another example of a lead frame 3 only formed of a three-layer composite metal portion 3a.

The method for forming the metallized layer 2 on the aluminum nitride base plate 1' may be a method conventionally used for soldering lead frames to an insulating base plate, or any of the above described methods such as the method for coating metal paste including tungsten, molybdenum or the like on an aluminum nitride base plate and firing the paste together with the base plate, or the method for forming a thin film of titanium, chromium or the like by vacuum evaporation or sputtering.

The metal soldering material is preferably a silver solder. However, it may be other metal soldering material insofar as it can ensure a good junction between the three-layer composite metal portion 3a of the lead frame 3 and the metallized layer 2 formed on the aluminum nitride base plate 1' by forming a thin coated layer of a metal having good wettability with the soldering material thereon. In addition, even in the case of using silver solder, if the metallized layer 2 includes tungsten as a major component, it is preferred to first form, before soldering as required, a thin plated layer 7 of nickel or the like on the metallized layer 2 and a plated layer 8 of nickel or the like on the surfaces of the three-layer composite metal portion 3a of each lead frame 3, to ensure a stable wettability for the metal solder 9. The plated layer may be formed on all the surfaces of each lead frame 3. In such a manner, adhesion and deposition of gold plating or the like applied by an aftertreatment can be improved and thus a uniform plated layer of gold or the like can be formed.

A description is now made of a cap to which a connection structure between components of a semiconductor apparatus in accordance with the present invention is applied, with reference to FIG. 7 showing an embodiment of the cap structure. A metallized layer 2 is formed on peripheral side surfaces of a covering member 11 formed as a sintered body of aluminum nitride. This metallized layer 2 is joined to a frame member 30 formed only of a metal layer 230 of an iron-nickel alloy by the metal solder 9 through a stress relieving member 130 of copper or the like. The lower end of the frame member 30 is joined to a ceramic base plate 101 through another metallized layer 2. A semiconductor device 4 is mounted on the ceramic base plate 101. A heat sink 6 is provided on an upper surface of the covering member 11, so that heat generated by the semiconductor device 4 is dissipated by the heat sink 6 through the covering member 11, and thus the cooling effect is enhanced. The metallized layers 2 are the same as those described above concerning the connection structure between the lead frames and the aluminum nitride base plate. The metal solder 9 to be used is preferably silver solder; however, it may be other soldering material insofar as it can ensure a good junction between the related surfaces of the frame member 30 and the metallized layers 2 by forming thin coated films of a metal having a good wettability with the soldering material thereon. Those thin layers have the same function as described above with regard to the embodiment of the connection structure between the lead frames and the aluminum nitride base plate.

FIG. 8 is a sectional view of another embodiment in which a connection structure between components for a semiconductor apparatus in accordance with the present invention is applied to a cap. According to FIG. 8, a metallized layer 2 is formed on peripheral side surfaces of a covering member 11 formed as a sintered body of aluminum nitride. A frame member 30 of a three-layer composite metal plate is joined to the metallized layer 2 by the metal solder 9. The frame member 30 has a composite structure including a metal layer 230 of a low expansion metal material such as Kovar and stress relieving layers 130 of a soft metal material such as copper, formed on both surfaces of the metal layer 230. The lower end of the frame member 30 is joined to a ceramic base plate 101 through another metallized layer 2. A semiconductor device 4 is mounted on the ceramic base plate 101. Further a heat sink 6 is provided on an upper surface of the covering member 11, to dissipate heat generated by the semiconductor device 4 through the covering member 11 and thus the cooling effect is enhanced. The metallized layers 2 and the metal solder 9 are the same as described above. In addition, a thin plated layer may be formed on the frame member 30 or on the junction surfaces of the metallized layers 2. The function of such thin plated layer is the same as described above.

The following description is made of examples A to E using samples prepared with base members in the form of an aluminum nitride sintered body obtained by the above described method in accordance with the invention.

EXAMPLE A

A metallizing process was applied to a base plate in the form of an aluminum nitride sintered body obtained by the above described method. The metallizing process was applied by the steps of coating a metal paste having a predetermined composition, on a surface of each sample of an aluminum nitride sintered base plate, applying a debinding agent thereto and then firing the base plate coated with the metal paste, in a nitrogen atmosphere at a temperature of 1600° C. for 60 minutes.

As a result, a metallized layer was formed on predetermined regions of the aluminum nitride sintered base plate. The metal paste used in this case was prepared by adding calcium oxide powder and alumina powder to tungsten powder and mixing the powders with an organic binder such as a "vehicle". The amount of calcium oxide powder added was 14 wt. % and that of alumina powder was 4 wt. %.

Further, a nickel plated layer of 2 μm in thickness was formed on the surface of the metallized layer. Then, as shown in FIG. 4C, a stress relieving member was interposed between each lead frame and the aluminum nitride sintered base plate and silver soldering was applied thereto at a temperature of 830° C. A dimensional relation in the junction between the aluminum nitride base plate and the lead frame, is shown in FIG. 9. A lead frame 3 having a width of 8 mm and a length of 10 mm was joined to the aluminum nitride base plate 1' having a length of 20 mm, by the silver solder 9. The junction area between the lead frame 3 and the aluminum nitride base plate 1' was 2 mm×8 mm. In order to evaluate a junction strength between the lead frame and the aluminum nitride base plate, tensile tests were carried out by pulling the lead frames 3 in the direction shown by the arrow, so as to measure the soldering strength. The results are shown in Table 1. More specifically, the soldering strength for each sample in Table 1 is an average value obtained based on five measured values. For comparison, an example of a junction between lead frames and a beryllia base plate is shown in Table 1 (as the sample No. 10).

According to Table 1, the soldering strengths of the samples not using any stress relieving member, were extremely low, i.e., 0.5 to 2 kg. In the case of the samples not using the stress relieving members, the starting point of breaking existing in each aluminum nitride base plate and cracks due to thermal stress were visible. In the case of the samples using stress relieving members for the junction between the lead frames and the aluminum nitride base plate in accordance with the present invention, it was found that a desired soldering strength can be obtained if the thickness of the stress relieving member is in the range from 0.01 to 1 mm with the lead frames having a thickness of 0.1 mm and a width of 8 mm.

In addition, after a metallized layer having the above described composition was formed on specified regions of the surface of each sample of the aluminum nitride base plate, a nickel plated layer of 2 to 3 μm in thickness and a gold plated layer of 2 to 3 μm in thickness were formed thereon. After that, a high power FET was soldered to the surface of the plated layer by a solder material of gold-silicon. Then, by using a method of $\Delta V_{BD}$, a change amount $\Delta V_{BE}$ caused by application of a forward drop voltage $V_{BE}$ between the emitter and the base of the transistor was measured and a thermal resistance of the unit including the transistor and the aluminum nitride base plate, was evaluated. The measured thermal resistance values of all the samples were less than 1.9° C./W. Consequently, it is understood that the aluminum nitride base plate is suited as a base plate on which a semiconductor device is to be mounted, from a view point of thermal conductivity.

TABLE 1

| No. | Lead Frame | Stress Relieving Member | Soldering strength (kg) |
|---|---|---|---|
| 1 | Kovar (t = 0.05 mm) | 4 μm Ni-plated Cu (t = 0.1 mm) | 13 |
| 2 | " | 4 μm Ni-plated Cu (t = 0.05 mm) | 11 |
| 3 | " | not provided | 1.3 |
| 4 | Kovar (t = 0.1 mm) | 4 μm Ni-plated Cu (t = 0.1 mm) | 13 |
| 5 | " | 4 μm Ni-plated Cu (t = 0.05 mm) | 12 |
| 6 | " | 4 μm Ni-plated Cu (t = 0.02 mm) | 9 |
| 7 | " | 4 μm Ni-plated Cu (t = 0.005 mm) | 4.5 |
| 8 | " | 4 μm Ni-plated Cu (t = 1.5 mm) | 0.8 |
| 9 | " | not provided | 1.5 |
| 10* | " | not provided | 5.5 |
| 11 | Kovar (t = 0.2 mm) | 4 μm Ni-plated Cu (t = 0.2 mm) | 10 |
| 12 | " | 4 μm Ni-plated Cu (t = 0.1 mm) | 8.5 |
| 13 | " | not provided | 1.2 |
| 14 | Kovar (t = 0.07 mm) | Cu (t = 0.1 mm) | 14 |
| 15 | " | Cu (t = 0.05 mm) | 12.5 |
| 16 | " | Cu (t = 0.03 mm) | 11 |
| 17 | " | not provided | 2 |
| 18 | Kovar (t = 0.1 mm) | Cu t = 0.1 mm) | 11 |
| 19 | " | Cu (t = 0.05 mm) | 8 |
| 20 | Kovar (t = 1.4 mm) | Cu (t = 0.01–1.0 mm) | 1.5 |
| 21 | " | not provided | 1.5 |
| 22 | Kovar (t = 0.1 mm) | Ni (t = 0.1 mm) | 7 |
| 23 | " | Ni (t = 0.05 mm) | 5 |
| 24 | Fe—Ni 42 alloy (t = 0.1 mm) | 4 μm Ni-plated Cu (t = 0.1 mm) | 10.5 |
| 25 | Fe—Ni 42 alloy (t = 0.1 mm) | 4 μm Ni-plated Cu (t = 0.05 mm) | 9 |
| 26 | Fe—Ni 42 alloy (t = 0.1 mm) | not provided | 1 |
| 27 | Fe—Ni 42 alloy (t = 0.2 mm) | 4 μm Ni-plated Cu (t = 0.2 mm) | 8.3 |
| 28 | Fe—Ni 42 alloy (t = 0.2 mm) | 4 μm Ni-plated Cu (t = 0.1 mm) | 7.3 |
| 29 | Fe—Ni 42 alloy (t = 0.2 mm) | not provided | 1 |
| 30 | Fe—Ni 42 alloy (t = 0.07 mm) | Cu (t = 0.03 mm) | 9.5 |
| 31 | Fe—Ni 42 alloy (t = 0.07 mm) | not provided | 2 |
| 32 | Fe—Ni 42 alloy | Ni (t = 0.1 mm) | 8.5 |

TABLE 1-continued

| No. | Lead Frame | Stress Relieving Member | Soldering strength (kg) |
|---|---|---|---|
| 33 | Fe—Ni 42 alloy (t = 0.1 mm) | Ni (t = 0.05 mm) | 7 |

*BeO base plate

EXAMPLE B

A metallized layer was formed on specified regions of a surface of a base plate formed as an aluminum nitride sintered body, by the following metallization processing. The metallization processing of samples was performed by applying tungsten paste of a prescribed composition to the surfaces of respective samples of the aluminum formed base plates shaped in a configuration such as a green sheet, by the aforementioned method with screen printing of prescribed patterns, drying, performing debindering and then sintering the same in a nitrogen atmosphere at a temperature of 1850° C. for 5 hours. Thus, metallized layers were formed on prescribed portions of aluminum nitride sintered base plates. Nickel plating layers of 2 μm in thickness were formed on the metallized layers, and sintered in a hydrogen atmosphere at a temperature of 750° C. for 20 minutes. Lead frames were joined on the metallized layer in the same manner as in the example A, whereby samples were prepared. The junction strength between the lead frames and the base plate of each sample was evaluated in the same manner as in the example A. The results are shown in Table 2.

From Table 2 it is found that the soldering strengths of the samples not using any stress relieving member were as low as 0.5 to 2 kg. The starting point of breaking of each of such samples existing in the aluminum nitride base plate and cracks due to thermal stress were found for each of such samples having a thickness of 0.1 mm. As shown in FIG. 5C or 6C, the junction portion of each lead frame was formed as a three-layer composite metal portion, or a two-layer composite metal portion, the composition thereof being shown in Table 3, and each lead frame had the same uniform thickness. The junction strength between the lead frames and the aluminum nitride base plate of each of ten samples prepared, was measured in the same manner as in the Example A. The results of the measurement of the junction strength are shown in Table 3 which indicates ranges of the different measured values of the ten samples.

As is evident from Table 3, in the case of using lead frames having three-layer composite metal portions and two layer composite metal portions for forming a junction with the respective aluminum nitride base plates, the junction strengths were remarkably improved compared with the cases of using conventional lead frames formed of only Kovar or 42-alloy. It is further understood that in the cases of using lead frames having three-layer composite metal portions, the ranges of difference in the junction strength were smaller to those in the cases of using lead frames having two-layer composite metal portions.

Further, bending strength tests were conducted with a time duration required for a free end of a lead frame to be bent at right angles and to be restored to the initial state, defined as "one cycle". As a result, as for the lead frames having three-layer composite metal portions and the conventional lead frames formed of only Kovar or

TABLE 2

| No. | Lead Frame | Stress Relieving Member | Soldering Strength (kg) |
|---|---|---|---|
| 1 | Kovar (t = 0.1 mm) | 4 μm Ni-plated Cu (t = 0.1 mm) | 13.5 |
| 2 | " | 4 μm Ni-plated Cu (t = 0.05 mm) | 10.5 |
| 3 | " | Cu (t = 0.1 mm) | 13 |
| 4 | " | Cu (t = 0.05 mm) | 10.5 |
| 5 | " | Ni = 0.1 mm) | 9.5 |
| 6 | " | Ni (t = 0.05 mm) | 7 |
| 7 | " | not provided | 1.5 |
| 8 | Fe—Ni 42 alloy (t = 0.1 mm) | 4 μm Ni-plated Cu (1 = 0.1 mm) | 14 |
| 9 | Fe—Ni 42 alloy (t = 0.1 mm) | 4 μm Ni-plated Cu (t = 0.05 mm) | 10.5 |
| 10 | Fe—Ni 42 alloy (t = 0.1 mm) | Cu (t = 0.1 mm) | 12 |
| 11 | Fe—Ni 42 alloy (t = 0.1 mm) | Cu (t = 0.05 mm) | 10.5 |
| 12 | Fe—Ni 42 alloy (t = 0.1 mm) | Ni (t = 0.1 mm) | 8.5 |
| 13 | Fe—Ni 42 alloy (t = 0.1 mm) | Ni (t = 0.05 mm) | 7 |
| 14 | Fe—Ni 42 alloy (t = 0.1 mm) | not provided | 1.5 |

EXAMPLE C

Lead frames were soldered without interposition of a stress relieving member, by silver solder at a temperature of about 830° C. to be joined onto a metallized layer including tungsten as a major component formed on a surface of an aluminum nitride base plate. In this case, the lead frames used had the shape shown in FIG. 9 42-alloy, more than 24 cycles were required until they were broken. On the other hand, the lead frames entirely formed of a two-layer composite metal portion were broken by 5 to 10 cycles and the lead frames formed of only a soft metal material were broken by 2 to 6 cycles.

TABLE 3

| No. | Stress Relieving Layer on Soldered Surface (μm) | Central Metal Layer (μm) | Stress Relieving Layer on Opposite Surface (μm) | Junction Strength (kg) | Breakage |
|---|---|---|---|---|---|
| 1 | Cu (20) | Kovar (60) | Cu (20) | 9.4~10.8 | In Lead Frame |
| 2 | Cu (40) | Kovar (60) | none | 2.4~10.1 | In Lead Frame |
| 3 | Cu (30) | 42 Alloy (40) | Cu (30) | 7.6~9.9 | In Lead Frame |
| 4 | Cu (40) | 42 Alloy (60) | none | ~7.1 | In Lead Frame |
| 5 | Fe (20) | Kovar (60) | Fe (20) | 5.6~7.7 | In Lead Frame |
| 6 | Ni (20) | Kovar (60) | Ni (20) | 6.0~6.9 | In Lead Frame |
| 7 | Fe (40) | 42 Alloy (60) | none | 3.1~5.8 | In Lead Frame |
| 8 | Ni (40) | 42 Alloy (60) | none | 5.2~6.1 | In Lead Frame |
| 9 | | Kovar (100) | | 0.9~1.4 | In AlN |
| 10 | | 42 Alloy (100) | | 0.8~1.1 | " |

Values in () represent thickness of the respective layers.

EXAMPLE D

In the same manner as in the Example C, lead frames having the same shape and the same thickness of 0.1 mm, were joined to an aluminum nitride base plate by soldering as shown in FIG. 9. Each lead frame was prepared to have a portion to be soldered including a three-layer composite metal portion, or a two-layer composite metal portion as shown in Table 4. Each lead frame was joined to a metallized layer including tungsten as a major component formed on specified regions of a surface of the aluminum nitride base plate as in the Example A, by a soldering process at a temperature within the range of 450° to 600° C. using a low melting metal soldering material having a composition of gold-silicon, gold-silver-germanium or the like. The junction strength was measured in the same manner as in the Example A with regard to ten samples of each kind thus obtained. The results of the measurement of the junction strength are shown in Table 4, which indicates the differences within the range of measured values.

As can be seen from Table 4, in the cases of using lead frames having three-layer composite metal portions and lead frames having two-layer composite metal portions, the junction strengths were remarkably improved compared with the conventional lead frames formed of only Kovar or 42-alloy. It is further understood that in the cases of using the lead frames having the three-layer composite metal portions, the differences in the junction strength were small.

TABLE 4

| No. | Stress Relieving Layer on Soldered Surface (μm) | Central Metal Layer (μm) | Stress Relieving Layer on Opposite Surface (μm) | Junction Strength (kg) | Breakage |
|---|---|---|---|---|---|
| 1 | Cu (30) | Kovar (40) | Cu (30) | 9.4~10.8 | In Lead Frame |
| 2 | Cu (40) | Kovar (60) | none | 1.9~10.1 | " |
| 3 | Cu (20) | 42 Alloy (60) | Cu (20) | 8.6~10.2 | " |
| 4 | Cu (40) | 42 Alloy (60) | none | ~8.0 | " |
| 5 | Fe (20) | Kovar (60) | Fe (20) | 8.9~11.0 | " |
| 6 | Fe (40) | 42 Alloy (60) | none | 2.4~7.6 | " |
| 7 | Ni (20) | Kovar (60) | Ni (20) | 6.5~8.1 | " |
| 8 | Ni (40) | 42 Alloy (60) | none | 1.0~7.1 | " |
| 9 | Al (20) | Kovar (60) | Al (20) | 10.1~11.4 | " |
| 10 | Al (40) | Kovar (60) | none | 11.2~12.2 | " |
| 11 | Al (20) | 42 Alloy (60) | Al (20) | 9.2~10.8 | " |
| 12 | Al (40) | 42 Alloy (60) | none | 8.8~11.0 | " |
| 13 | | Kovar (100) | | 1.6 | In AlN |
| 14 | | 42 Alloy (100) | | 1.8 | " |

Values () represent thickness of the respective layers.

EXAMPLE E

A metallized layer including molybdenum as a major component was formed in the same manner as in the Example A, on a surrounding portion of a covering member formed as a sintered body of aluminum nitride having a thickness of 3 mm and an area of 10 mm × 10 mm. After nickel plating was applied to the metallized layer, a frame member 0.1 mm thick was soldered thereon by a silver solder at a temperature of 830° C. This frame member was formed as a three-layer composite metal shown in Table 5. In the case of using copper as an outer layer portion of the frame member, a nickel plating process was applied before the soldering. Warping and airtightness of each of the caps thus obtained were measured. The warping was measured as the value a as shown in FIG. 11 in the junction between a covering member 11 and a frame member 30. Airtightness was measured by placing each cap in a helium gas atmosphere and evacuating the cap as shown in FIG. 12. The junction portion between a covering member of an aluminum nitride sintered body and a frame member was examined by a scanning type electronic microscope at a magnification of 5000 or a stereoscopic microscope at a magnification of 40 to examine cracks or defects.

Samples each having a frame member of a two-layer composite metal or a single-layer composite metal were also prepared for comparison and the warping and airtightness thereof were measured.

The results of the measurements are shown in Table 5. The values of warping indicated in Table 5 are average values each obtained from five measured values. As can be clearly seen from Table 5, the caps having the connection structures in accordance with the present invention have excellent characteristics in resistance to warping and airtightness. In addition, no cracks were found in the junction portions of the caps in accordance with the present invention.

TABLE 5

| No. | | Three layer Composite Metal | | | Warping ($\mu$m) | Airtightness (atmcc/sec) | Observation of Structure |
|---|---|---|---|---|---|---|---|
| | | Outer Layer on Soldered Surface | Central Layer | Outer Layer on Opposite Surface | | | |
| Samples of the Invention | 1 | Cu (20) | Kovar (60) | Cu (20) | 4.8 | $1 \times 10^{-11}$ | No Cracks |
| | 2 | Cu (20) | 42 Alloy (60) | Cu (20) | 5.6 | $1.5 \times 10^{-11}$ | " |
| | 3 | Fe (20) | Kovar (60) | Fe (20) | 12.1 | $1.6 \times 10^{-11}$ | " |
| | 4 | Fe (20) | 42 Alloy (60) | Fe (20) | 13.6 | $1.2 \times 10^{-11}$ | " |
| | 5 | Ni (20) | Kovar (60) | Ni (20) | 6.2 | $2.0 \times 10^{-11}$ | " |
| | 6 | Ni (20) | 42 Alloy | Ni (20) | 7.8 | $2.1 \times 10^{-11}$ | " |
| Samples for Comparison | 1 | Cu (20) | Kovar (80) | — | 52.1 | Incapable of Being Measured | " |
| | 2 | Fe (40) | 42 Alloy (60) | — | 41.6 | Incapable of Being Measured | " |
| | 3 | Kovar (100) | — | — | 100.6 | Incapable of Being Measured | Cracks |
| | 4 | 42 Alloy (100) | — | — | 12.1 | Incapable of Being Measured | " |

Values in () represent thickness of the respective layers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A connection structure between components of a semiconductor apparatus, comprising: a base member made of aluminum nitride having a major surface on which a semiconductor device is to be mounted, said aluminum nitride having a first thermal expansion coefficient, a connection member to be joined to said base member, said connection member being made of an alloy selected from the group consisting of iron-nickel alloys and iron-nickel-cobalt alloys having a second thermal expansion coefficient, a plastically deformable stress relieving member interposed between said aluminum nitride base member and said connection member, and a soldering material for joining said base member, said stress relieving member, and said connection member, said plastically deformable stress relieving member being made of a material selected from the group consisting of copper, copper alloys, nickel alloys, iron, and aluminum having a plastic deformability sufficiently high for relieving a thermal stress caused by a difference between said first and second thermal expansion coefficients of said base member and of said connection member during a cooling process at the time of soldering.

2. A connection structure in accordance with claim 1, wherein said connection member includes a lead frame.

3. A connection structure in accordance with claim 2, wherein said stress relieving member has a thickness in the range from 0.01 to 1 mm when said lead frame has a thickness of 0.1 mm and a width of 8 mm.

4. A connection structure in accordance with claim 1, wherein said base member includes a sintered body.

5. A connection structure in accordance with claim 1, wherein said connection structure further comprises a metallized layer formed on a junction surface of said base member.

6. A connection structure in accordance with claim 5, wherein said metallized layer contains at least a metal selected out of tungsten and molybdenum, at least an aluminum compound selected among the group of aluminum nitride, aluminum oxide and aluminum oxynitride, and calcium oxide.

7. A connection structure in accordance with claim 5, further comprising a plated layer formed on a surface of said metallized layer to be jointed with said soldering material.

8. A connection structure in accordance with claim 7, further comprising a plated layer formed on a surface of said connection member to be joined with said soldering material.

9. A cap for airtightly enclosing and protecting a semiconductor device mounted on an insulating base plate, comprising: a covering member made of aluminum nitride, a frame member to be joined to said covering member to surround said semiconductor device located under said covering member, said frame member being made of an alloy selected from the group consisting of iron-nickel alloys and iron-nickel-cobalt alloys, a plastically deformable stress relieving member interposed between said covering member and said frame member, and a soldering member for joining said covering member, said stress relieving member and said frame member, said plastically deformable stress relieving member being of a material selected from the group consisting of copper, copper alloys, nickel, nickel alloys, iron, and aluminum which have a plastic deformability sufficient for relieving a thermal stress caused between said covering member and said frame member by a difference between a thermal expansion coefficient of said covering member and a thermal expansion coefficient of said frame member during a cooling process at the time of soldering.

* * * * *

UNITED STATES PATENT AND TRADEMARK OFFICE
CERTIFICATE OF CORRECTION

PATENT NO. : 5,010,388  
DATED : April 23, 1991  
INVENTOR(S) : Sasame et al.

Page 1 of 3

It is certified that error appears in the above-indentified patent and that said Letters Patent is hereby corrected as shown below:

Col. 16, line 23, replace "$\Delta V_{BD}$" by --$\Delta V_{BE}$--.

Col. 16, Table 1, No. 18: replace No. 18 to read:

--18  Kovar (t = 0.1 mm)  Cu(t = 0.1 mm)  11--.

Col. 17, Table 2, No. 5: replace No. 5 to read:

--5  "  Ni (t = 0.1 mm)  9.5--;

Col. 17, Table 2, No. 8: replace No. 8 to read:

--8  Fe-Ni 42 alloy (t = 0.1 mm)  4 $\mu$m Ni-plated Cu (t = 0.1 mm)  14--;

Col. 19, Table 3, in heading of second table column, replace "($\mu$m" by --($\mu$m)--;

Col. 19, Table 3, No. 3: replace No. 3 to read:

--3  Cu(30)  42 Alloy (40)  Cu(30)  7.6 ~ 9.9  In Lead Frame--;

Col. 19, Table 3, No. 9: replace No. 9 to read:

--9  Kovar (100)  0.9~1.4  In AlN--.

Col. 20, Table 4, No. 5: replace No. 5 to read:

--5  Fe(20)  Kovar (60)  Fe(20)  8.8~11.0  "  --;

UNITED STATES PATENT AND TRADEMARK OFFICE
CERTIFICATE OF CORRECTION

PATENT NO. : 5,010,388
DATED : April 23, 1991
INVENTOR(S) : Sasame et al.

It is certified that error appears in the above-indentified patent and that said Letters Patent is hereby corrected as shown below:

Col. 20, Table 4, No. 7: replace No. 7 to read:
 --7 Ni(20)   Kovar (60)   Ni(20)   6.6~8.1   "   --;

Col. 20, Table 4, No. 13: replace No. 13 to read:
 --13   Kovar (100)   1.6   In AlN--;

Col. 21, Table 5, No. 6: replace No. 6 to read:
 --6 Ni(20)  42 Alloy (60)   Ni(20)   7.8  $2.1 \times 10^{-11}$   "--;

Col. 21, Table 5, Samples for Comparison, No. 4: replace No. 4 to read:
 --4 42 Alloy   -   -   121.8   Incapable   "   --.
  (100)       of Being
              Measured

In the Claims:

Col. 21, Claim 2, claim line 1, replace "A" by --The--.
Col. 21, claim 3, claim line 1, replace "A" by --The--;
 claim line 3, replace "when" by --, and wherein--.
Col. 21, claim 4, claim line 1, replace "A" by --The--;
 claim line 2, replace "includes" by --of aluminum nitride is--.

UNITED STATES PATENT AND TRADEMARK OFFICE
CERTIFICATE OF CORRECTION

PATENT NO. : 5,010,388

DATED : April 23, 1991

INVENTOR(S) : Sasame et al.

It is certified that error appears in the above-indentified patent and that said Letters Patent is hereby corrected as shown below:

```
Col. 21, Claim 5, claim line 1, replace "A" by --The--;
         claim line 2, delete "wherein said connection structure",
                       replace "comprises" by --comprising--.
         claim line 4, before "base" insert --aluminum nitride--.
Col. 22, Claim 6, claim line 1, replace "A" by --The--;
         claim line 2, after "contains" insert --calcium oxide--;
         claim line 3, replace "out" by --from a first group
                       consisting--, before "at" insert --and--;
         claim line 4, replace "among the group" by --from a
                       second group consisting--;
         claim line 6, delete ", and calcium oxide".
Col. 22, Claim 7, claim line 1, replace "A" by --The--;
         claim line 3, replace "jointed" by --joined--.
Col. 22, Claim 8, claim line 1, replace "A" by --The--.
```

Signed and Sealed this

Fourth Day of April, 1995

Attest:

BRUCE LEHMAN

*Attesting Officer*   *Commissioner of Patents and Trademarks*